(12) United States Patent
Cho et al.

(10) Patent No.: US 7,517,815 B2
(45) Date of Patent: Apr. 14, 2009

(54) SPIN-ON GLASS COMPOSITION, METHOD OF PREPARING THE SPIN-ON GLASS COMPOSITION AND METHOD OF FORMING A POROUS SILICON OXIDE LAYER USING THE SPIN-ON GLASS COMPOSITION

(75) Inventors: Jun-Hyun Cho, Suwon-si (KR); Jung-Sik Choi, Seongnam-si (KR); Jung-Ho Lee, Suwon-si (KR); Mi-Ae Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 386 days.

(21) Appl. No.: 11/446,152

(22) Filed: Jun. 5, 2006

(65) Prior Publication Data

US 2006/0276053 A1 Dec. 7, 2006

(30) Foreign Application Priority Data

Jun. 7, 2005 (KR) .................. 10-2005-0048147

(51) Int. Cl.
  *H01L 21/31* (2006.01)
(52) U.S. Cl. ................ 438/782; 438/783; 257/E21.261
(58) Field of Classification Search ................. 438/782, 438/783
  See application file for complete search history.

(56) References Cited

U.S. PATENT DOCUMENTS 6,162,838 A * 12/2000 Kohl ........................... 521/77
6,662,631 B2 * 12/2003 Baklanov et al. ............... 73/38
6,780,499 B2 * 8/2004 Gates et al. ............... 428/315.7
7,229,910 B2 * 6/2007 Usami ......................... 438/624
7,323,407 B2 * 1/2008 Lee et al. ..................... 438/623
2002/0130396 A1 * 9/2002 Hawker et al. .............. 257/642
2002/0137276 A1 * 9/2002 Park ........................... 438/241
2003/0094032 A1 * 5/2003 Baklanov et al. ............... 73/38
2005/0054183 A1 * 3/2005 Park ........................... 438/597
2005/0079719 A1 * 4/2005 Colburn et al. .............. 438/694
2005/0171277 A1 * 8/2005 Li et al. ...................... 524/588
2006/0121721 A1 * 6/2006 Lee et al. ..................... 438/618
2006/0141693 A1 * 6/2006 Hagiwara et al. ........... 438/222

FOREIGN PATENT DOCUMENTS

JP 2004-311532 11/2004
KR 1020050005004 A 1/2005
KR 1020050040275 A 5/2005

* cited by examiner

*Primary Examiner*—Alexander G Ghyka
(74) *Attorney, Agent, or Firm*—Volentine & Whitt, PLLC

(57) ABSTRACT

A spin-on glass composition includes a solvent, about 3 to about 20 percent by weight of a porogen, and about 3 to about 20 percent by weight of a silsesquioxane oligomer represented by formula (1),

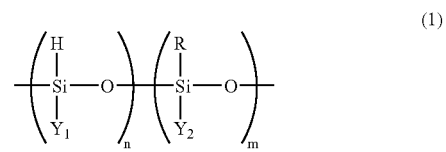

where, in the formula (1), $Y_1$ and $Y_2$ independently represent a hydrolyzable alkoxy group, R represents a lower alkyl group, and n and m independently represent an integer in a range of one to nine both inclusive.

11 Claims, 16 Drawing Sheets

SPIN-ON GLASS COMPOSITION, METHOD OF PREPARING THE SPIN-ON GLASS COMPOSITION AND METHOD OF FORMING A POROUS SILICON OXIDE LAYER USING THE SPIN-ON GLASS COMPOSITION

A claim of priority under 35 USC § 119 is made to Korean Patent Application No. 2005-48147 filed on Jun. 7, 2005, the contents of which are herein incorporated by reference in their entireties.

BACKGROUND OF THE INVENTION

1. Field of the Invention

Example embodiments of the present invention relate to spin-on glass (SOG) compositions, methods of preparing spin-on glass compositions, and methods of forming porous silicon oxide layers using spin-on glass compositions.

2. Description of the Related Art

In order to increase the integration degree and operational speed of semiconductor devices, the distance between conductive patterns and the width of conductive patterns of such devices have been reduced. Examples of semiconductor devices of this type include large-scale integration (LSI) semiconductor devices, high-speed static random access memory (SRAM) devices, flash memory devices, and so on.

Examples of the conductive patterns in semiconductor devices include word lines, bit lines, and various other types of metal wirings. When the distance between the conductive patterns is reduced, a parasitic capacitance between the conductive patterns increases, and as a result a resistance-capacitance (RC) delay and/or crosstalk may be occur during operation of the semiconductor device.

To reduce the parasitic capacitance in the semiconductor device, an insulation layer positioned between the conductive patterns may be formed of a material having a low dielectric constant. Typically, the low dielectric constant layer is formed by chemical vapor deposition (CVD) or spin-on deposition.

When the insulation layer is formed by spin-on deposition, the insulation layer may be formed, for example, using hydrogen silsesquioxane (HSQ) or methyl silsesquioxane (MSQ). Hydrogen silsesquioxane and methyl silsesquioxane has a dielectric constant of at least about 3.0, which may not be low enough to sufficiently reduce the parasitic capacitance between conductive patterns. Thus, a porous insulation layer having a dielectric constant lower than or equal to about 2.5 has been recently developed and applied in the manufacture of semiconductor devices.

Methods of forming a porous insulation layer are disclosed in Korean Laid-Open Patent Publication No. 2005-5004, Japanese Laid-Open Patent Publication No. 2004-311532 and U.S. Pat. No. 6,780,499.

The porous insulation layers disclosed in these publications are formed by introducing a thermally degradable material into an insulation layer and by removing the thermally degradable material from the insulation layer in a thermal treatment process. The porous insulation layer includes a plurality of pores having a dielectric constant of about 1.0, and thus the overall dielectric constant of the porous insulation layer is very low. As a result, the parasitic capacitance between the conductive patterns is substantially reduced.

Examples of porous insulation layers include porous hydrogen silsesquioxane (P-HSQ) layers and porous methyl silsesquioxane (P-MSQ) layers. However, a Si—H bond in a hydrogen silsesquioxane layer is easily substituted with a Si—OH bond by an amine-based solvent in a stripping process for removing a photoresist pattern. The hydrogen silsesquioxane layer including the Si—OH bond easily absorbs moisture, and as a result the dielectric constant of the hydrogen silsesquioxane layer can increase. Further, a hydrogen silsesquioxane layer which includes a Si—OH bond can be excessively etched in an etching process. In addition, a Si—CH$_3$ bond in a methyl silsesquioxane layer is more easily broken in an ashing process using oxygen plasma than is a Si—H bond in a hydrogen silsesquioxane layer. Thus, the methyl silsesquioxane layer is easily etched and can be deformed in subsequent processes which can result in poor adhesion characteristics.

That is, the pores contained in porous hydrogen silsesquioxane layers and porous methyl silsesquioxane layer can cause these layers to be easily deformed in subsequent processes. This can result in poor adhesion characteristics with respect to underlying and overlying layers.

SUMMARY OF THE INVENTION

According to one aspect of the present invention, a spin-on glass composition is provided which includes a solvent, about 3 to about 20 percent by weight of a porogen, and about 3 to about 20 percent by weight of a silsesquioxane oligomer represented by formula (1):

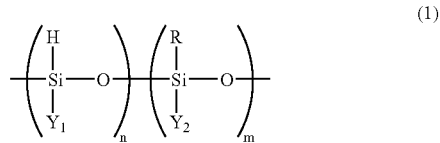

wherein, in the formula (1), $Y_1$ and $Y_2$ independently represent a hydrolyzable alkoxy group, R represents a lower alkyl group, and n and m independently represent an integer in a range of one to nine both inclusive.

According to another aspect of the present invention, a method of preparing a spin-on glass composition is provided which includes synthesizing a silsesquioxane oligomer represented by formula (1), and mixing about 3 to about 20 percent by weight of the silsesquioxane oligomer, about 3 to about 20 percent by weight of a porogen, and about 60 to about 94 percent by weight of a solvent:

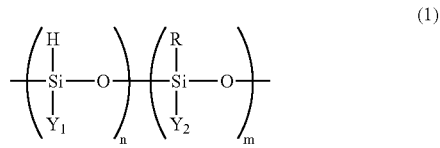

wherein, in the formula (1), $Y_1$ and $Y_2$ independently represent a hydrolyzable alkoxy group, R represents a lower alkyl group, and n and m independently represent an integer in a range of one to nine both inclusive.

According to still another aspect of the present invention, a method of forming a porous silicon oxide layer is provided which includes forming a spin-on glass layer on a substrate by coating the substrate with a spin-on glass composition which includes a solvent, about 3 to about 20 percent by weight of a porogen, and about 3 to about 20 percent by weight of a silsesquioxane oligomer represented by formula (1), and baking the spin-on glass layer to form the porous oxide layer,

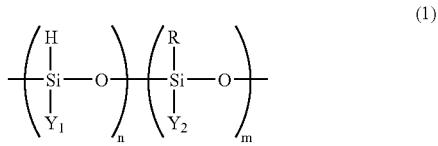

(1)

wherein, in the formula (1), $Y_1$ and $Y_2$ independently represent a hydrolyzable alkoxy group, R represents a lower alkyl group, and n and m independently represent an integer in a range of one to nine both inclusive.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF EXAMPLE EMBODIMENTS

Figure 1:
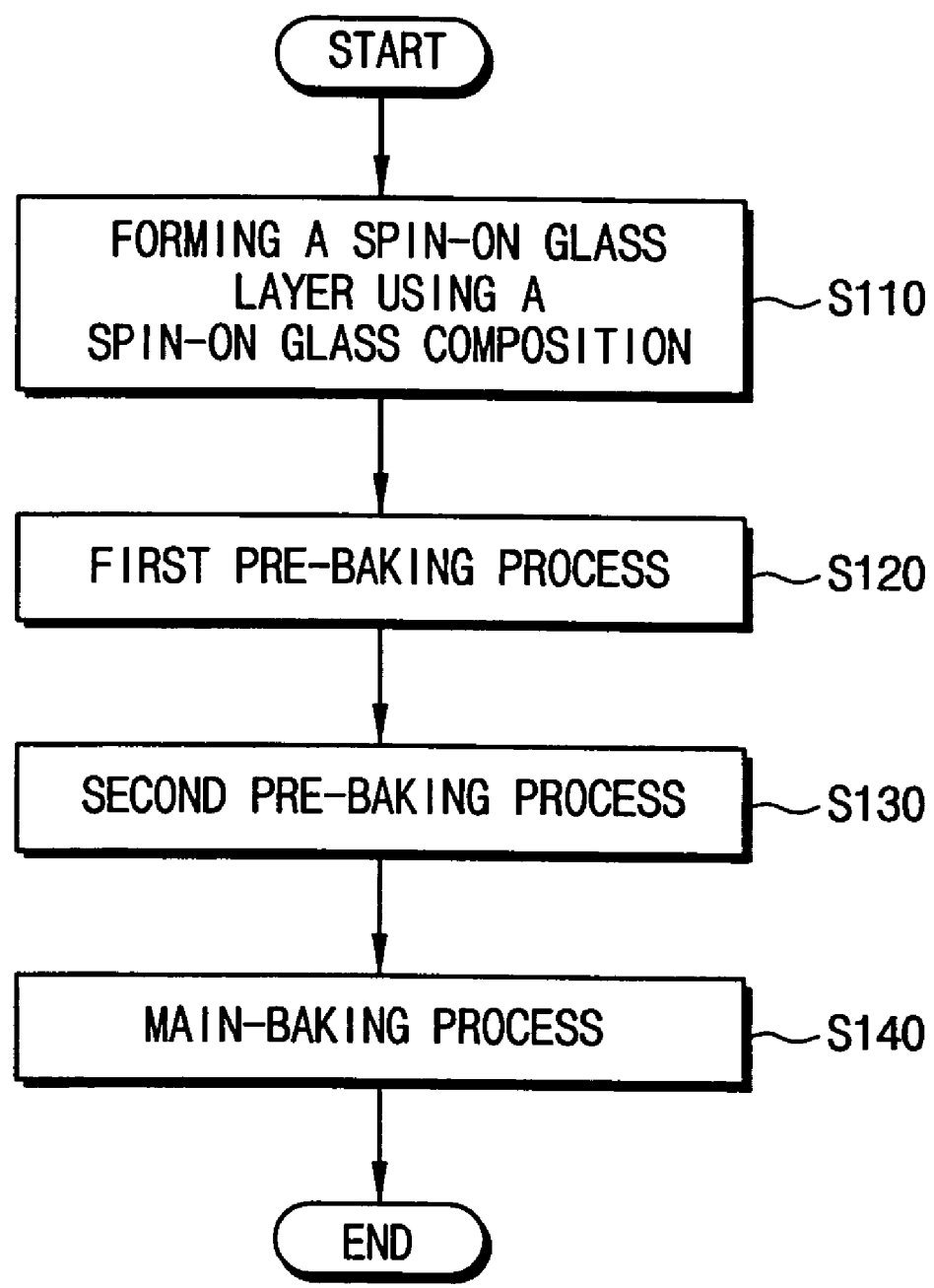
FIG. 1 is a flow chart illustrating a method of forming a porous silicon oxide layer using a spin-on glass composition in accordance with an example embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, fourth, fifth, sixth, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spin-on Glass Composition

A spin-on glass composition according to embodiments of the present invention includes a silsesquioxane oligomer, a porogen (i.e. a pore generating agent) and a solvent. In a particular embodiment, the spin-on glass composition includes about 3 to about 20 percent by weight of the silsesquioxane oligomer, about 3 to about 20 percent by weight of the porogen, and all or part of the remainder of the solvent.

The spin-on glass composition may be utilized to from a porous silicon oxide layer that has a dielectric constant lower than or equal to about 2.5, that exhibits enhanced adhesion characteristics to an upper layer and/or a lower layer, and that reduces a parasitic capacitance between conductive patterns. Hereinafter, the porous silicon oxide layer formed using the spin-on glass composition according embodiments of the present invention will be referred to as an alkyl-hydrogen silsesquioxane layer.

The silsesquioxane oligomer in the spin-on glass composition that may be used for forming the alkyl-hydrogen silsesquioxane layer is represented by the following formula (1):

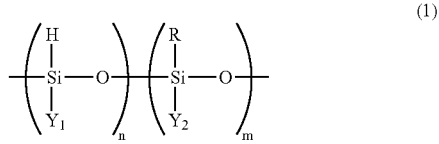

(1)

In the formula (1), $Y_1$ and $Y_2$ independently represent a hydrolyzable alkoxy group, R represents a lower alkyl group, and n and m independently represent an integer in a range of one to nine both inclusive. In the formula (1), a ratio of n to m (i.e., "n:m") may be in a range of about 1:0.4 to about 1:2.4. Non-limiting examples of the alkoxy group include a methoxy group, an ethoxy group, an isopropoxy group, and a butoxy group. Non-limiting examples of the alkyl group may include a methyl group, an ethyl group, a propyl group, and a butyl group. For example, R advantageously represents a methyl group.

The silsesquioxane oligomer may be prepared by a condensation reaction of a first monomer represented by the following formula (2) with a second monomer represented by the following formula (3).

(2)

In the formula (2), $Y_1$, $Y_2$ and $Y_3$ independently represent a hydrolyzable alkoxy group. Non-limiting examples of the alkoxy group of $Y_1$, $Y_2$ and $Y_3$ include a methoxy group, an ethoxy group, an isopropoxy group, and a butoxy group.

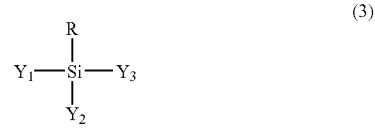

(3)

In the formula (3), $Y_1$, $Y_2$ and $Y_3$ independently represent a hydrolyzable alkoxy group and R represents a lower alkyl group. Non-limiting examples of the alkoxy group of $Y_1$, $Y_2$ and $Y_3$ include a methoxy group, an ethoxy group, an isopropoxy group, and a butoxy group. Non-limiting examples of the alkyl group may include a methyl group, an ethyl group, a propyl group, and a butyl group. For example, R advantageously presents a methyl group.

In a particular example, the first monomer is a monomer of hydrogen silsesquioxane, and the second monomer is a monomer of an alkyl silsesquioxane such as, for example, methyl silsesquioxane, ethyl silsesquioxane, propyl silsesquioxane, and butyl silsesquioxane. When R represents a methyl group, the second monomer may be a monomer of methyl silsesquioxane.

The silsesquioxane oligomer may be prepared by a condensation reaction of the first monomer with the second monomer at a molar ratio of about 1:0.4 to about 1:2.4.

When the molar ratio between the first monomer and the second monomer that may be used for preparing the silsesquioxane oligomer is less than about 1:0.4, a dielectric constant of the alkyl-hydrogen silsesquioxane layer may be raised and adhesion characteristics may be deteriorated, which is unpreferable. In addition, when the molar ratio between the first monomer and the second monomer used in the condensation reaction is greater than about 1:2.4, the dielectric constant of the alkyl-hydrogen silsesquioxane layer may be reduced, but an etch resistance may be unpreferably deteriorated and the alkyl-hydrogen silsesquioxane layer may be excessively etched by an amine-based etching solution. Therefore, a reaction ratio between the first monomer and the second monomer for preparing the silsesquioxane oligomer is preferably about 1:0.4 to about 1:2.4, and more preferably about 1:0.6 to about 1:1.5. When R of the second monomer represents a methyl group, the reaction ratio between the first monomer and the second monomer is preferably about 1:1.

The silsesquioxane oligomer may be used to form the alkyl-hydrogen silsesquioxane layer so as to overcome problems associated with the conventionally used hydrogen silsesquioxane (HSQ) layer including only a Si—H bond and the conventionally used methyl silsesquioxane (MSQ) layer including only a Si—CH$_3$ bond.

Particularly, the hydrogen silsesquioxane layer easily absorbs moisture so as to be excessively etched by an amine-based etching solution in an etching process and/or a cleaning process. The Si—CH$_3$ bond in the methyl silsesquioxane layer may be broken in an ashing process using oxygen compared with the Si—H bond in the hydrogen silsesquioxane layer. Thus, the hydrogen silsesquioxane layer and the methyl silsesquioxane layer may be damaged or deformed in subsequent processes which can result in poor adhesion characteristics.

In contrast, the alkyl-hydrogen silsesquioxane layer formed using the spin-on glass composition including the silsesquioxane oligomer may not be excessively etched by the amine-based etching solution in an etching process and/or a cleaning process. Furthermore, damage or deformation of the alkyl-hydrogen silsesquioxane layer may be prevented in an ashing process, so that adhesion characteristics of the alkyl-hydrogen silsesquioxane layer to overlying and/or underlying layers may be enhanced.

When the spin-on glass composition includes less than about 3 percent by weight of the silsesquioxane oligomer, a thickness of the alkyl-hydrogen silsesquioxane layer formed using the spin-on glass composition may not be easily adjusted. In addition, when the content of the silsesquioxane oligomer is greater than about 20 percent by weight, the silsesquioxane oligomer may be unstable in the spin-on glass composition and the alkyl-hydrogen silsesquioxane layer thus formed may have a crack. Therefore, the spin-on glass composition of the embodiments of the present invention includes about 3 to about 20 percent by weight of the silsesquioxane oligomer, preferably, about 4 to about 12 percent by weight of the silsesquioxane oligomer, and more preferably about 4 to about 10 percent by weight of the silsesquioxane oligomer.

Non-limiting examples of the porogen that may be used for the spin-on glass composition of the embodiments of the present invention include a thermally degradable polymer such as a polyalkylene glycol, polyethylene glycol dimethyl ether or a combination thereof. Non-limiting examples of the polyalkylene glycol include poly methylene glycol, poly ethylene glycol, and poly propylene glycol. These can be used alone or in a mixture of two or more thereof.

The porogen may preferably have a weight average molecular weight of about 100 to about 2,000. When the weight average molecular weight of the porogen is less than about 100, the alkyl-hydrogen silsesquioxane layer formed using the spin-on glass composition may have extremely small pores such that the dielectric constant of the alkyl-hydrogen silsesquioxane layer may unpreferably increase. In addition, when the weight average molecular weight of the porogen is greater than about 2,000, the alky-hydrogen silsesquioxane layer may have pores so large that the alkyl-hydrogen silsesquioxane layer may be excessively etched in a subsequent process such as an etching process, a cleaning process, and other processes. Also, physical characteristics of the alkyl-hydrogen silsesquioxane layer may be unpreferably deteriorated. Thus, the porogen in the spin-on glass composition preferably has a weight average molecular weight of about 100 to about 2,000, more preferably a weight average molecular weight of about 150 to about 1,000, and most preferably a weight average molecular weight of about 200 to about 600.

When the spin-on glass composition includes less than about 3 percent by weight of the porogen, the alkyl-hydrogen silsesquioxane layer formed using the spin-on glass composition may have a small amount of pores that the dielectric constant of the alky-hydrogen silsesquioxane layer may increase. In addition, when the content of the porogen is greater than about 20 percent by weight, an amount of pores generated in the alkyl-hydrogen silsesquioxane layer may be excessively large so that the alkyl-hydrogen silsesquioxane layer may be over-etched or damaged in a subsequent process. Thus, the spin-on glass composition of embodiments of the present invention includes about 3 to about 20 percent by weight of the porogen, preferably, about 4 to about 12 percent by weight of the porogen, and more preferably about 4 to about 10 percent by weight of the porogen.

Non-limiting examples of the solvent that may be used for the spin-on glass composition of the present invention may include an aliphatic hydrocarbon solvent, an aromatic hydrocarbon solvent, a ketone-based solvent, an ether-based solvent, an ester-based solvent, an alcohol-based solvent, and an amide-based solvent. These can be used alone or in a mixture of two or more thereof. For example, the spin-on glass composition includes propylene glycol dimethyl ether as the solvent.

When the spin-on glass composition includes less than about 60 percent by weight of the solvent, the silsesquioxane oligomer included in the spin-on glass composition may not be stably polymerized in a formation of the alkyl-hydrogen silsesquioxane layer and a crack may be generated in the alkyl-hydrogen silsesquioxane layer formed. In addition, when the content of the solvent is greater than about 94 percent by weight, a thickness of the alkyl-hydrogen silsesquioxane layer may not be easily adjusted. Therefore, the spin-on glass composition of embodiments of the present invention preferably includes about 60 to about 94 percent by weight of the solvent, more preferably about 76 to about 94 percent by weight of the solvent, and more preferably about 80 to about 90 percent by weight of the solvent.

In an example embodiment of the present invention, the spin-on glass composition may include the silsesquioxane oligomer, the porogen, the solvent and an additive. Particularly, the spin-on glass composition may include about 3 to about 20 percent by weight of the silsesquioxane oligomer, about 3 to about 20 percent by weight of the porogen, about 10 to about 300 parts per million of the additive and a remainder of the solvent. The silsesquioxane oligomer, the porogen and the solvent are previously described so any further explanations in these regards will be omitted.

The additive may enhance adhesion characteristics of the alkyl-hydrogen silsesquioxane layer to an upper layer and/or a lower layer. Non-limiting examples of the additive that may be used in the spin-on glass composition of embodiments of the present invention include tetramethylammonium hydroxide, tetrabutylammonium hydroxide, methyltributylammonium hydroxide, and hexadecyltrimethylammonium hydroxide. These can be used alone or in a mixture of two or more thereof.

As the content of the additive in the spin-on glass composition increases, the dielectric constant of the alkyl-hydrogen silsesquioxane layer may decrease, but the alkyl-hydrogen silsesquioxane layer may unpreferably have a low stability. Thus, the spin-on glass composition preferably includes about 10 to about 300 parts per million of the additive, and more preferably about 50 to about 200 parts per million of the additive.

The spin-on glass composition may be used for forming a spin-on glass layer on a substrate having a stepped portion. The spin-on glass layer may be formed using the spin-on glass composition by a spin coating process. Example of the substrate having a stepped portion may include a semiconductor substrate on which conductive patterns or conductive wirings are formed. The spin-on glass layer may be converted into a porous silicon oxide layer that may reduce a parasitic capacitance between the conductive patterns.

The spin-on glass composition including the silsesquioxane oligomer may be used for forming the porous silicon oxide layer having a desired dielectric constant and enhanced adhesion characteristics to underlying and/or overlying layers. Furthermore, damage to the porous silicon oxide layer in an etching process using an amine-based etching solution may be reduced or prevented, and deformation of the porous silicon oxide layer in an ashing process using oxygen may be reduced or prevented.

Method of Preparing a Spin-On Glass Composition

A method of preparing a spin-on glass composition according to non-limiting embodiments of the present invention will be fully described hereinafter.

A silsesquioxane oligomer represented by formula (1) is first synthesized, and the spin-on glass composition is prepared by mixing about 3 to about 20 percent by weight of the silsesquioxane oligomer, about 3 to about 20 percent by weight of a porogen and about 60 to about 94 percent by weight of a solvent.

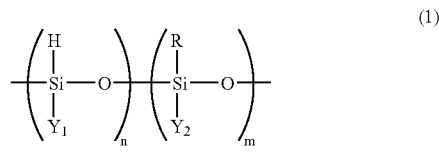
(1)

In the formula (1), $Y_1$ and $Y_2$ independently represent a hydrolyzable alkoxy group, R represents a lower alkyl group, and n and m independently represent an integer in a range of one to nine both inclusive. A ratio of n to m may be in a range of about 1:0.4 to about 1:2.4. Non-limiting examples of the alkoxy group include a methoxy group, an ethoxy group, an isopropoxy group, and a butoxy group. Non-limiting examples of the alkyl group include a methyl group, an ethyl group, a propyl group, and a butyl group. For example, R advantageously represents a methyl group.

The silsesquioxane oligomer may be synthesized by a condensation reaction of a first monomer represented by formula (2) with a second monomer represented by formula (3).

(2)

In the formula (2), $Y_1$, $Y_2$ and $Y_3$ independently represent a hydrolyzable alkoxy group. Non-limiting examples of the alkoxy group of $Y_1$, $Y_2$ and $Y_3$ include a methoxy group, an ethoxy group, an isopropoxy group, and a butoxy group.

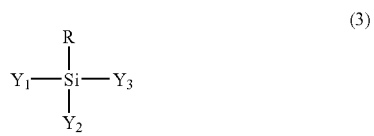
(3)

In the formula (3), $Y_1$, $Y_2$ and $Y_3$ independently represent a hydrolyzable alkoxy group and R represents a lower alkyl group. Non-limiting examples of the alkoxy group of $Y_1$, $Y_2$ and $Y_3$ include a methoxy group, an ethoxy group, an isopropoxy group, and a butoxy group. Non-limiting examples of the lower alkyl group include a methyl group, an ethyl group, a propyl group, and a butyl group. For example, R advantageously represents a methyl group.

Method of Forming a Porous Oxide Layer

A method of forming a porous oxide layer using the spin-on glass composition according to embodiments of the present invention will now be fully described with reference to the accompanying drawings.

FIG. 1 is a flow chart illustrating a method of forming a porous oxide layer using the spin-on glass composition in accordance with an example embodiment of the present invention.

Referring to FIG. 1, a spin-on glass layer is formed on a substrate by coating the spin-on glass composition including a silsesquioxane oligomer, a porogen and a solvent in step S110, and then the spin-on glass layer is baked to form the porous oxide layer in steps S120 to S140.

The silsesquioxane oligomer included in the spin-on glass composition is represented by formula (1).

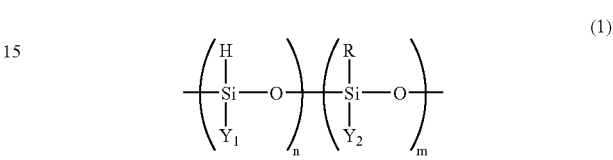
(1)

In the formula (1), $Y_1$ and $Y_2$ independently represent a hydrolyzable alkoxy group, R represents a lower alkyl group, and n and m independently represent an integer in a range of one to nine both inclusive. A ratio of n to m may be in a range of about 1:0.4 to about 1:2.4. The spin-on glass composition may further include an additive to enhance adhesion characteristics of the porous oxide layer to an underlying layer and/or an overlying layer. The spin-on glass composition is previously described and a more detailed description thereof is omitted here to avoid redundancy in the description.

The substrate may include a stepped portion such as a conductive pattern. Non-limiting examples of the conductive pattern include a gate electrode, a bit line electrode, a pad, and a metal wiring. The spin-on glass layer formed on the substrate including the conductive patterns may be used for forming an insulation layer that isolates the conductive patterns. Although the spin-on glass layer is formed on the substrate having a stepped portion, the spin-on glass layer may have an even surface.

The spin-on glass layer is baked in steps S120 to S140 and converted into the porous oxide layer.

The porous oxide layer may be a porous alkyl-hydrogen silsesquioxane layer. The porous alkyl-hydrogen silsesquioxane layer may have a dielectric constant lower than or equal to about 2.5. The porous alkyl-hydrogen silsesquioxane layer may include a Si—H bond and a Si—R bond at a ratio of about 1:0.4 to about 1:2.4. Non-limiting examples of the porous alkyl-hydrogen silsesquioxane layer include a methyl-hydrogen silsesquioxane layer, an ethyl-hydrogen silsesquioxane layer, a propyl-hydrogen silsesquioxane layer, and a butyl-hydrogen silsesquioxane layer.

Hereinafter, a baking process of the spin-on glass layer will be fully described.

The spin-on glass layer is baked by heat to be converted into a porous oxide layer. The baking process may be performed by a pre-baking process of steps S120 and S130, and a main-baking process of step S140.

In the pre-baking process, the solvent may be removed from the spin-on glass layer, the silsesquioxane oligomer in the spin-on glass layer may be copolymerized and the porogen in the spin-on glass layer may be thermally decomposed. The pre-baking process may be performed at a temperature of about 70° C. to about 350° C. for about 3 minutes to about 15 minutes. The pre-baking process may be performed under an atmosphere not including oxygen gas to prevent an oxidation of the spin-on glass layer. For example, the pre-baking process may be performed under an atmosphere including an inactive gas such as nitrogen gas or argon gas.

The pre-baking process may be performed by a first pre-baking process of step S120 and a second pre-baking process of step S130. The first pre-baking process may be performed at a temperature of about 70° C. to about 150° C. to remove the solvent from the spin-on glass layer without a thermal stress to the substrate. The second pre-baking process may be performed at a temperature of about 150° C. to about 350° C. to thermally decompose the porogen and to partially convert the spin-on glass layer into a porous silicon oxide layer.

When the temperature of the pre-baking process is lower than about 70° C., the solvent may not be easily removed from the spin-on glass layer, which is unpreferable. In addition, when the temperature of the pre-baking process is higher than about 350° C., the spin-on glass layer may not be completely converted into the porous silicon oxide layer in a subsequent main-baking process, and the spin-on glass layer may be too rapidly converted into the porous silicon oxide layer such that a crack may be unpreferably generated in the porous silicon oxide layer. Thus, the pre-baking process may be preferably performed at a temperature of about 70° C. to about 350° C.

In the main-baking process of step S140, the spin-on glass layer may be converted into the porous silicon oxide layer by a copolymerization of the silsesquioxane oligomer, and the porous silicon oxide layer may be also densified. The main-baking process may be performed at a temperature substantially higher than that of the pre-baking process. For example, the main-baking process may be performed at a temperature of about 350° C. to about 550° C.

When the temperature of the main-baking process is lower than about 350° C., the spin-on glass layer may not be completely converted into the porous silicon oxide layer and the porous silicon oxide layer may not be sufficiently densified, which is unpreferable. In addition, when the temperature of the main-baking process is higher than about 550° C., a crack may be unpreferably generated in the porous silicon oxide layer, conductive patterns formed on the substrate may be deteriorated, and adhesion characteristics of the porous silicon oxide layer to the substrate may become poor. Thus, the main-baking process may be preferably performed at a temperature of about 350° C. to about 550° C.

When metal wirings are formed on a semiconductor substrate, the main-baking process may be preferably performed at a temperature of about 350° C. to about 550° C., and more preferably at a temperature of about 400° C. to about 450° C.

The main-baking process may be performed for about 10 minutes to about 100 minutes. When the time of the main-baking process is shorter than about 10 minutes, the silsesquioxane oligomer may not be completely copolymerized, which is unpreferable. In addition, when the process time is longer than about 100 minutes, stress in the porous silicon oxide may increase to generate a crack therein. Thus, the main-baking process may be preferably performed for about 10 minutes to about 100 minutes, and more preferably for about 20 minutes to about 60 minutes.

The main-baking process may be performed under an atmosphere including an inactive gas such as nitrogen or argon.

The porous silicon oxide layer formed using the spin-on glass composition of embodiments the present invention may be used as an insulation layer for isolating metal wirings and/or filling a via in a semiconductor manufacturing process.

Method of Manufacturing a Semiconductor Device

A method of manufacturing a semiconductor device using the spin-on glass composition of embodiments of the present invention will now be fully described with reference to the accompanying drawing.

FIGS. 2 to 10 are cross-sectional views for explaining a method of manufacturing a semiconductor device using the spin-on glass composition of embodiments of the present invention.

Figure 2:
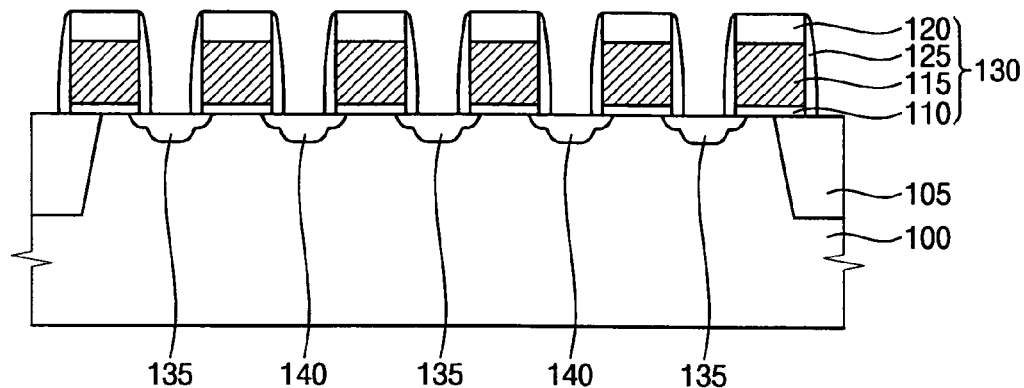
FIGS. 2 to 10 are cross-sectional views illustrating a method of manufacturing a semiconductor device using the spin-on glass composition of the present invention.

FIG. 2 is a cross-sectional view for explaining a method of forming gate structures 130 and contact regions 135 and 140 on a semiconductor substrate 100.

Referring to FIG. 2, an isolation layer 105 is formed at an upper portion of the semiconductor substrate 100 by an isolation process such as a shallow trench isolation (STI) process to divide the semiconductor substrate 100 into an active region and a field region. A gate insulation layer is formed on the semiconductor substrate 100 using an oxide. A first conductive layer and a gate mask 120 are successively formed on the gate insulation layer. The first conductive layer may be formed using polysilicon doped with impurities. The first conductive layer may have a multi-layer structure having a doped polysilicon layer and a metal silicide layer formed on the doped polysilicon layer. The first conductive layer will be patterned to form a gate electrode 115 on the gate insulation layer.

The first conductive layer and the gate insulation layer are successively patterned using the gate mask 120 as an etching mask. As a result, each of gate structures 130 includes the gate insulation layer pattern 110, the gate electrode 115 and the gate mask 120. A gate spacer 125 is formed on sidewalls of the gate structures 130. In this manner, word lines having a parallel structure are formed on the semiconductor substrate 100.

Impurities are implanted onto a surface of the semiconductor substrate 100 exposed between the gate structures 130 using the gate structures 130 as an ion-implantation mask. A thermal treatment process is performed on the semiconductor substrate 100 to form a first contact region 135 and a second contact region 140 in the semiconductor substrate 100. The first contact region 135 and the second contact region 140 may correspond to source/drain regions. The first contact region 135 and the second contact region 140 may also correspond to a capacitor contact region and a bit line contact region, respectively.

Figure 3:
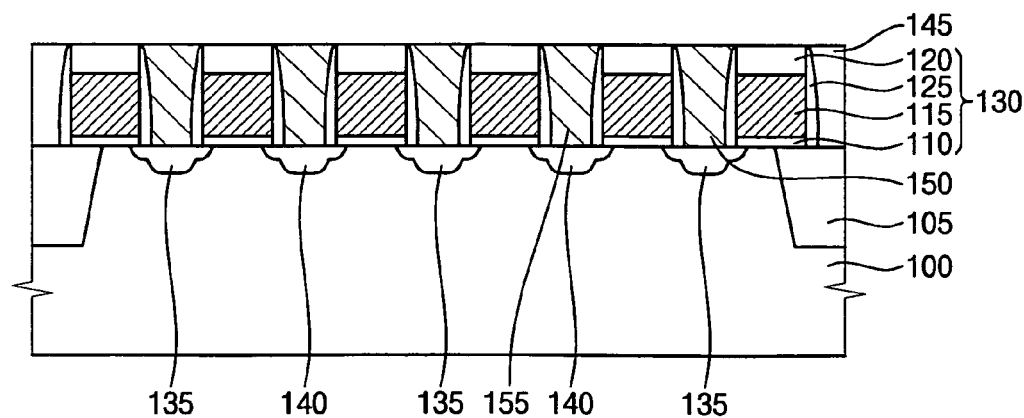

FIG. 3 is a cross-sectional view for explaining a step of forming a first insulation interlayer 145, a first pad 150 and a second pad 155 on the semiconductor substrate 100.

Referring to FIG. 3, the first insulation interlayer 145 is formed on the semiconductor substrate 100. The first insulation interlayer 145 is partially removed by a chemical mechanical polishing (CMP) process or an etch back process until an upper face of the gate structures 130 is exposed. Thus, the first insulation interlayer 145 may have a planarized upper face. A first photoresist pattern (not shown) is formed on the first insulation interlayer 145, and then the first insulation interlayer 145 is anisotropically etched using the first photoresist pattern as an etching mask to form first contact holes (not shown) exposing the semiconductor substrate 100 in the first and second contact regions.

When the first gate mask 125 is formed using a material that has a high etching selectivity relative to the first insulation interlayer 145, the first contact holes may be self-aligned to the gate structures 130. Some of the first contact holes expose the first contact region 135 corresponding to a capacitor contact region, and others of the first contact holes expose the second contact region 140 corresponding to a bit line contact region.

The first photoresist pattern is removed by an ashing process and/or a stripping process. A second conductive layer is formed on the first insulation interlayer to fill up the first contact holes. The second conductive layer may be formed using polysilicon doped with impurities or a metal such as tungsten, aluminum or copper.

The second conductive layer is partially removed by a CMP process, an etch back process or a combination process of CMP and etch back until an upper face of the first insulation interlayer is exposed. As a result, the first pad 150 and the second pad 155 are formed on the semiconductor substrate 100 and in the first contact holes. The first and second pads 150 and 155 may be self-aligned contact is (SAC) pads. The first pad 150 is formed on the semiconductor substrate 100 in the first contact region 135 corresponding to a capacitor contact region. The second pad 155 is formed on the semiconductor substrate 100 in the second contact region 140 corresponding to a bit line contact region.

Figure 4:
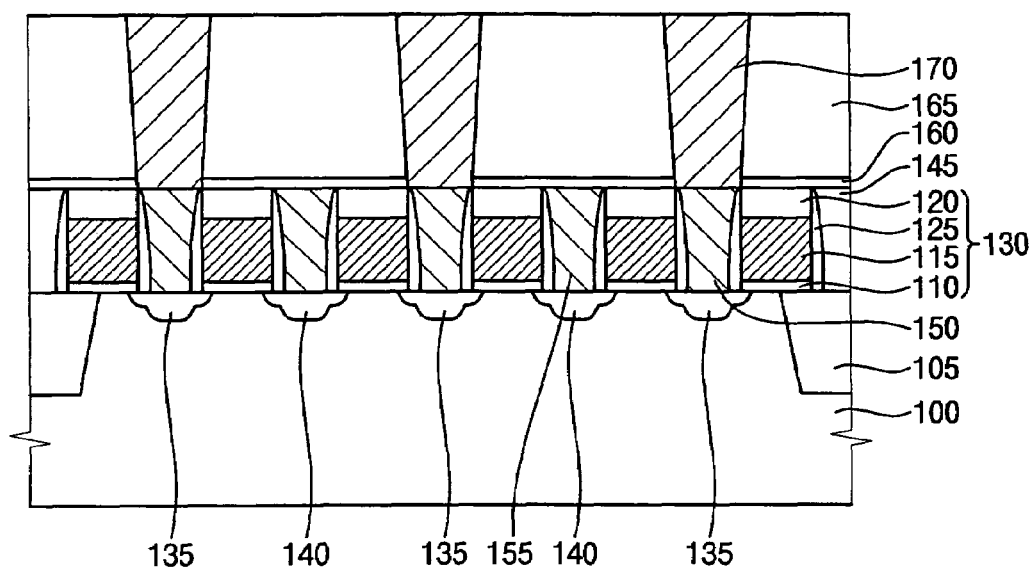

FIG. 4 is a cross-sectional view for explaining a step of forming a third pad (not shown) and a fourth pad 170.

Referring to FIG. 4, a second insulation interlayer 160 is formed on the first insulation interlayer 145 and the first and second pads 150 and 155. The second insulation interlayer 160 may electrically isolate the first pad 150 from a bit line formed in a subsequent process. After a second photoresist pattern (not shown) is formed on the second insulation interlayer 160, the second insulation interlayer 160 is partially etched using the second photoresist pattern as an etching mask to form a second contact hole (not shown) exposing the second pad 155. The third pad will be formed in the second contact hole to electrically connect the bit line to the second pad 155.

After the second photoresist pattern is removed by an ashing process and/or a stripping process, a third conductive layer (not shown) is formed on the second insulation interlayer 160 to fill up the second contact hole. The third conductive layer may be formed using a metal such as tungsten. A bit line mask (not shown) is formed on the third conductive layer.

The third conductive layer is patterned using the bit line mask as an etching mask to form the third pad that fills up the second contact hole. The third pad corresponds to a bit line electrode. As a result, a bit line (not shown) including the third pad and the bit line mask is formed on the second insulation interlayer and the second pad 155.

A nitride layer (not shown) may be formed on the second insulation interlayer and the bit line, and then may be anisotropically etched to form a bit line spacer (not shown) on a sidewall of the bit line. The bit line spacer may prevent the bit line from being damaged while the fourth pad 170 is formed in subsequent processes.

A third insulation interlayer 165 is formed on the second insulation interlayer 160 to cover the bit line on which the bit line spacer is formed. The third insulation interlayer 165 is partially removed by a CMP process until an upper face of the bit line is exposed. A third photoresist pattern (not shown) is formed on the third insulation interlayer, and then the third insulation interlayer 165 and the second insulation interlayer 160 are anisotropically etched using the third photoresist pattern as an etching mask to form a third contact hole (not shown) exposing the first pad 150. The third contact hole may be formed by a self-alignment process relative to the bit line including the bit line spacer.

A fourth conductive layer is formed on the third insulation interlayer 165 to fill up the third contact hole. The fourth conductive layer is partially removed by a CMP process until upper faces of the third insulation interlayer 165 and the bit line are exposed. As a result, the fourth pad 170 is formed in the third contact hole. The fourth pad 170 may be formed using polysilicon doped with impurities and a metal. The fourth pad 170 makes contact with the first pad 150 formed on the first contact region 135. The fourth pad 170 may electrically connect the first pad 150 to a lower electrode subsequently formed.

Figure 5:
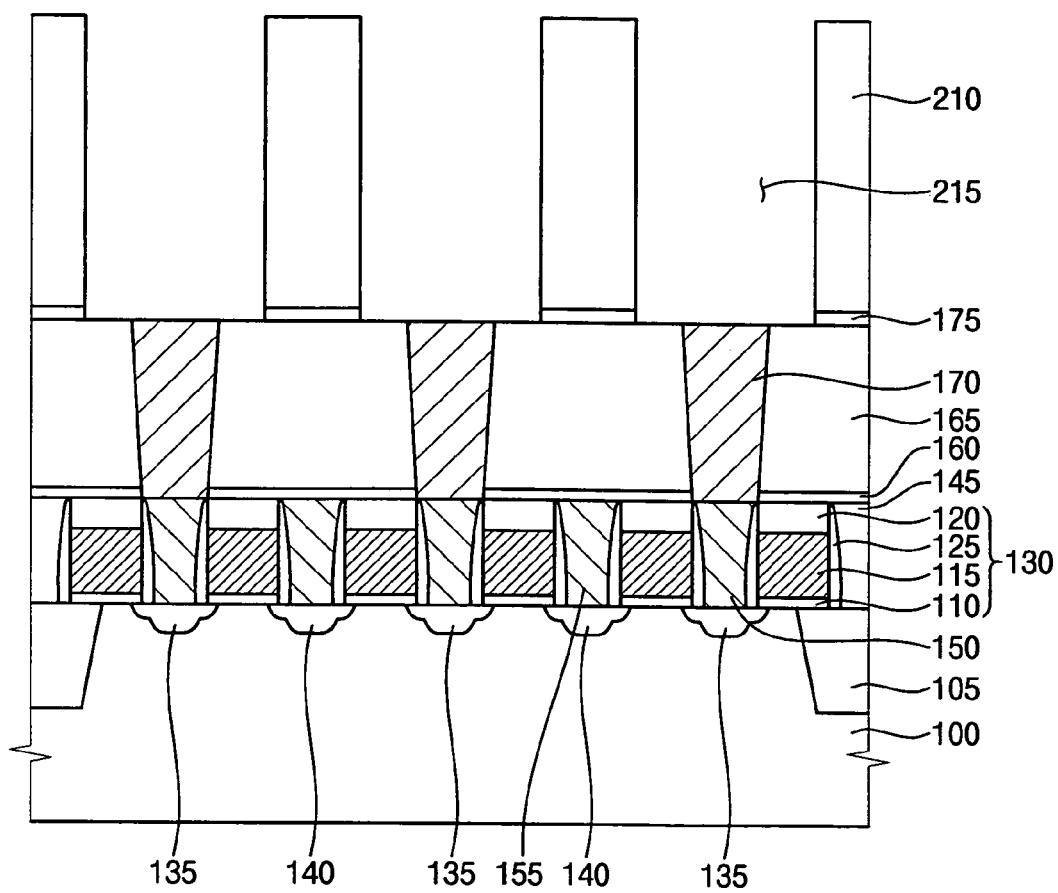

FIG. 5 is a cross-sectional view for explaining a step for forming an etch stop layer 175 and a mold layer 210 on the third insulation interlayer 165 and the fourth pad 170.

Referring to FIG. 5, the etch stop layer 175 is formed on the fourth pad 170, the third insulation interlayer 165 and the bit line. The etch stop layer 175 may prevent the fourth pad 170 from being damaged in an etching process for forming an opening 215 in the mold layer 210. For example, the etch stop layer 175 has a thickness of about 10 to about 300 Å. The etch stop layer 175 may be formed using a material that has an etch rate substantially lower than that of the mold layer 210. For example, the etch stop layer 175 is formed using a nitride or a metal oxide.

The mold layer 210 is formed on the etch stop layer 175 using an oxide. A mask pattern (not shown) is formed on the mold layer 210 using a material that has an etching selectivity relative to the mold layer 210. An exposed portion of the mold layer 210 is anisotropically etched using the mask pattern as an etching mask to form the opening 215 exposing the etch stop layer 175. The etch stop layer 175 is selectively removed in an etching process to expose the fourth contact 170.

Figure 6:
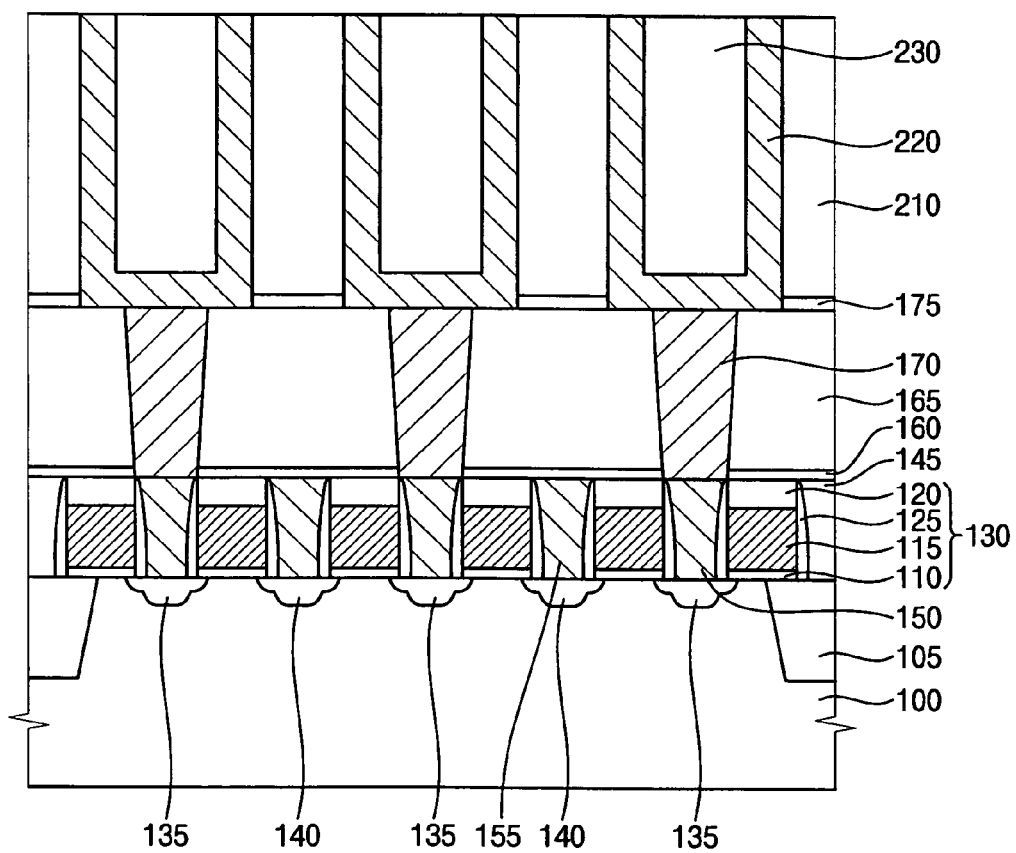

FIG. 6 is a cross-sectional view for explaining a step of forming a lower electrode 220 in the opening 215.

Referring to FIG. 6, a lower electrode layer is continuously formed on a sidewall of the mold layer 210, an upper face of the fourth contact 170 and an upper face of the mask pattern. The lower electrode layer may be formed using a conductive material such as a metal, a metal nitride such as titanium nitride, or polysilicon doped with impurities. The lower electrode layer may have a thickness of about 300 Å to about 500 Å.

A sacrificial layer is formed on the lower electrode layer to fill up the opening 215. The sacrificial layer may be formed using an oxide or a photoresist. The lower electrode layer and the sacrificial layer are partially removed by a CMP process, an etch back process or a combination of CMP and etch back until an upper face of the mold layer is exposed. As a result, the lower electrode 220 and a sacrifice photoresist pattern 230 are formed in the opening 215. The sacrificial photoresist pattern 230 may prevent the lower electrode 220 from being damaged in the removal process for forming the lower electrode 220 and a subsequent etching process for removing the mold layer 220.

Figure 7:
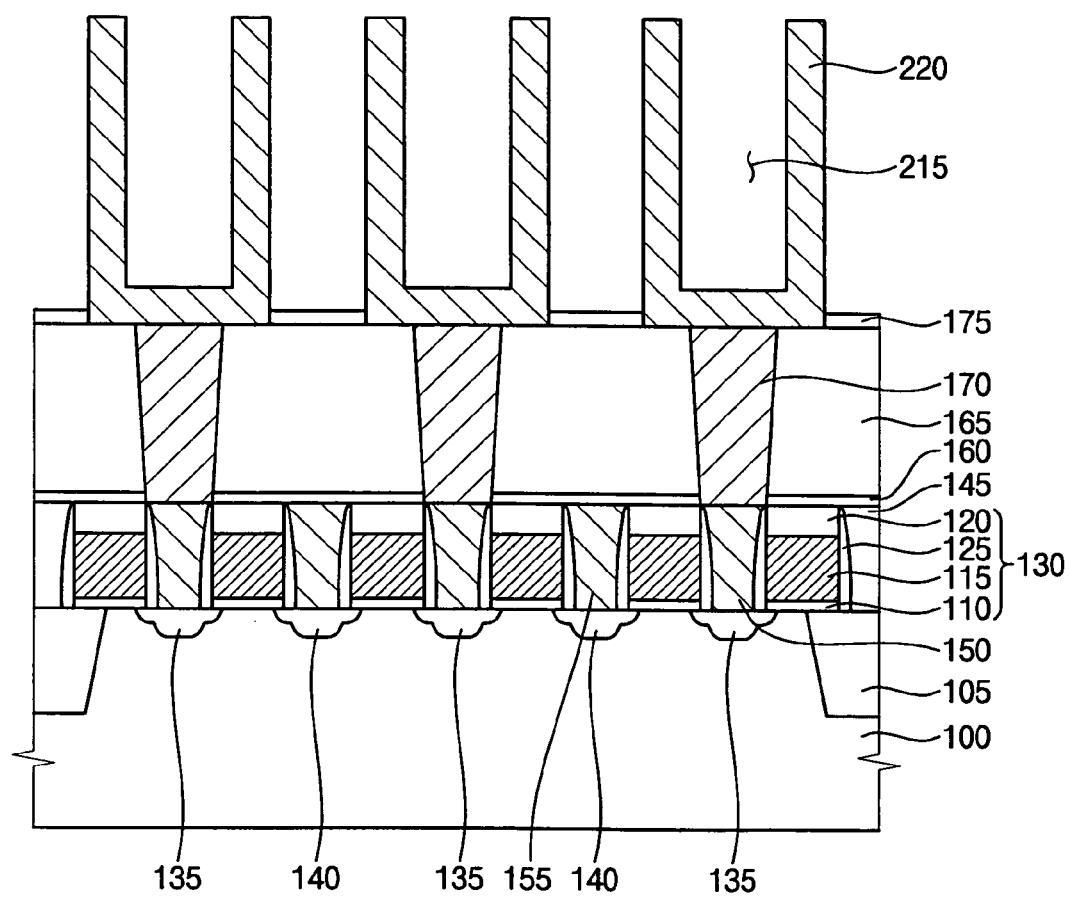

FIG. 7 is a cross-sectional view for explaining a step of removing the mold layer 210 and the sacrifice photoresist pattern 230.

Referring to FIG. 7, the mold layer 210 and the sacrificial photoresist pattern 230 are successively removed to form the lower electrode 220 that is electrically connected to the fourth pad 170. The lower electrode 220 may have a cylindrical shape including a sidewall and a bottom face.

Figure 8:
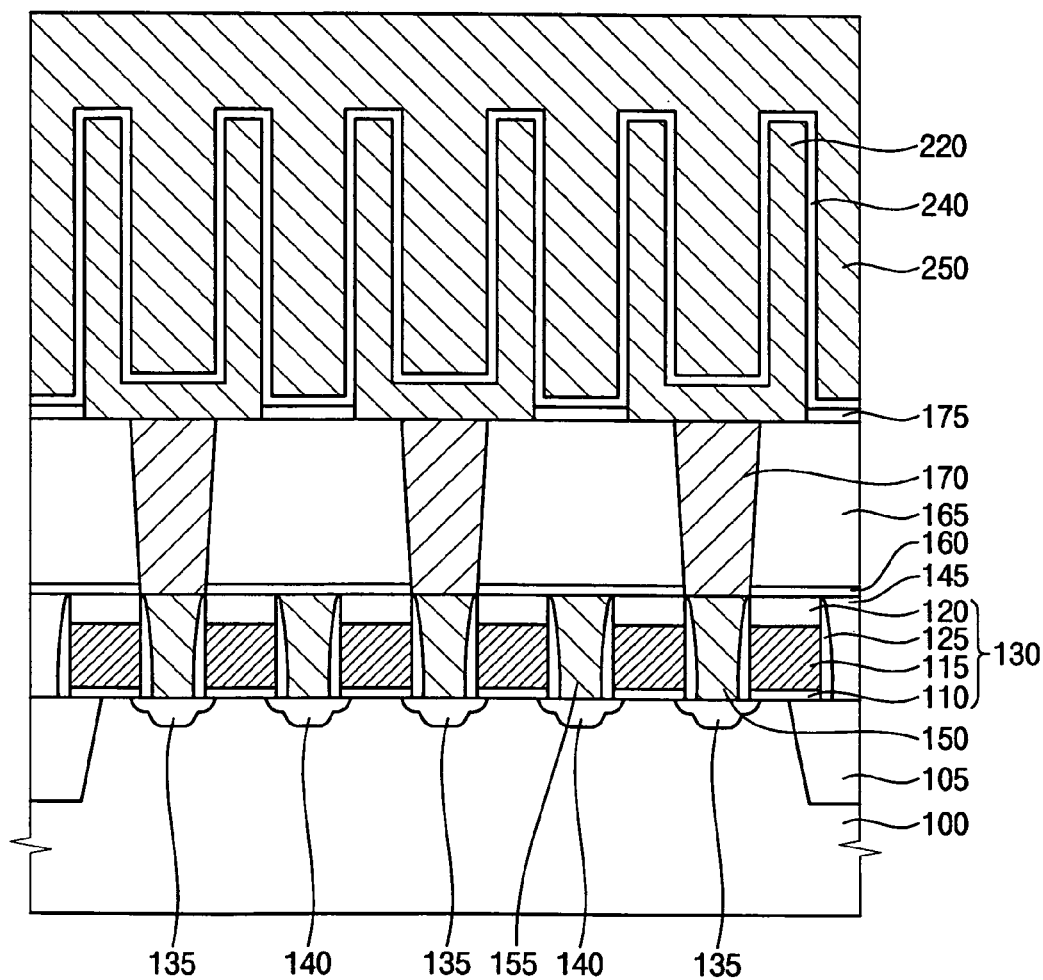

FIG. 8 is a cross-sectional view for explaining a step of forming a dielectric layer 240 and an upper electrode 250 on the lower electrode 220.

Referring FIG. 8, the dielectric layer 240 is formed on the lower electrode 220 by an atomic layer deposition (ALD) process or a chemical vapor deposition (CVD) process. For example, the dielectric layer 240 is formed using a material having a high dielectric constant such as aluminum oxide or hafnium oxide by the ALD process.

The upper electrode 250 is formed on the dielectric layer 240. The upper electrode 250 may be formed using doped polysilicon, a metal or a metal nitride such as titanium nitride. The upper electrode 250 may be formed by the CVD process. As a result, a capacitor including the lower electrode 220, the dielectric layer 240 and the upper electrode 250 may be formed on the fourth pad 170 and the third insulation interlayer 165.

Figure 9:
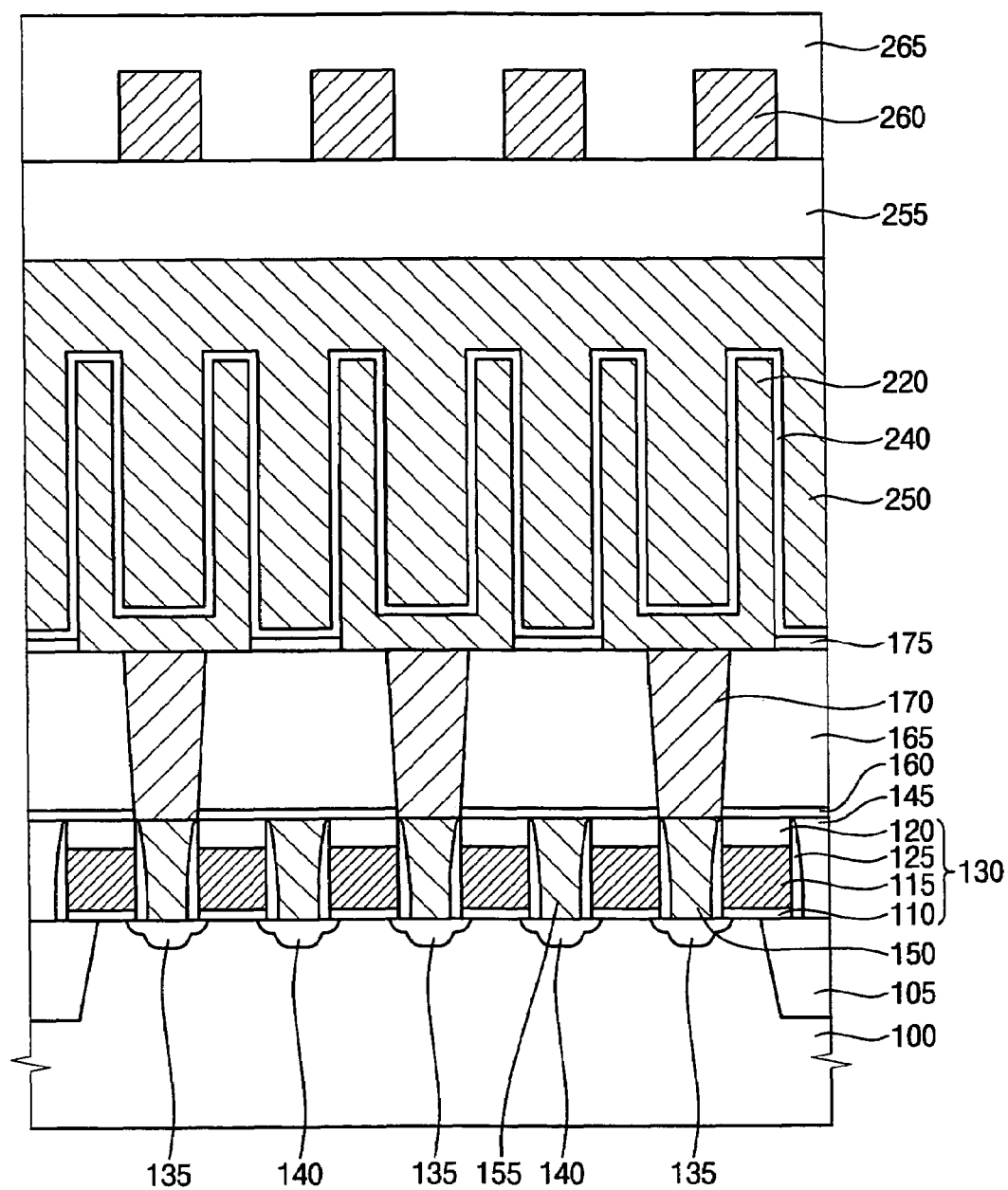

FIG. 9 is a cross-sectional view for explaining a step of forming a fourth insulation interlayer 255, a fifth insulation interlayer 265 and a first metal wiring 260 on lower structures.

Referring to FIG. 9, the fourth insulation interlayer 255 is formed on the lower structures that are formed on the semiconductor substrate 100. The lower structures may include the gate structures 130, the first to fourth pads 150, 155 and 170, the bit line, the capacitor, etc. The fourth insulation interlayer 255 may be formed using an oxide. A first metal wiring 260 is formed on the fourth insulation interlayer 255. The first metal wiring 260 may be formed using a metal such as aluminum, tungsten, or copper. For example, the first metal wiring 260 is formed by depositing aluminum and by performing a photolithography process on an aluminum layer.

The fifth insulation interlayer 265 is formed on the fourth insulation interlayer 255 to cover the first metal wiring 260. An additional oxide thin film (not shown) may be formed on the fourth insulation interlayer 255 and the first metal wiring 260 by a CVD process before formation of the fifth insulation interlayer 265. The additional oxide thin film may enhance gap-filling characteristics and adhesion characteristics of the fifth insulation interlayer 265.

The fifth insulation interlayer 265 may be a porous alkyl-hydrogen silsesquioxane layer formed using the spin-on glass composition in accordance with an example embodiment of the present invention. The alkyl-hydrogen silsesquioxane layer may have a dielectric constant lower than or equal to about 2.5 and include a Si—H bond and a Si—R bond (e.g. Si—CH$_3$) at a ratio of about 1:0.8 to about 1:1.2.

Particularly, the spin-on glass composition including about 3 to about 20 percent by weight of a silsesquioxane oligomer represented by the formula (1), about 3 to about 20 percent by weight of a porogen, and a solvent is prepared. The fourth insulation interlayer 255 on which the first metal wiring 260 is formed is coated with the spin-on glass composition to form a spin-on glass layer. The spin-on glass layer may completely cover the first metal wiring 260.

A first pre-baking process may be performed on the spin-on glass layer at a temperature of about 80° C. to about 150° C. (e.g. about 100° C.) for about 6 minutes. A second pre-baking process may be performed on the spin-on glass layer at a temperature of about 150° C. to about 350° C. (e.g. about 300° C.) for about 3 minutes. A main-baking process may be performed on the spin-on glass layer at a temperature of about 350° C. to about 550° C. (e.g. about 400° C.) for about 35 minutes. The first and second pre-baking processes may be performed under an atmosphere including an inactive gas without oxygen, and the main-baking process may be performed under an atmosphere such as oxygen atmosphere, water vapor atmosphere, nitrogen atmosphere, or a combination atmosphere of oxygen, water vapor and nitrogen.

The spin-on glass layer is converted into the porous alkyl-hydrogen silsesquioxane layer including a Si—H bond and a Si—R bond (e.g. Si—CH$_3$) at a ratio of about 1:0.8 to about 1:1.2. The porous alkyl-hydrogen silsesquioxane may have enhanced adhesion characteristics to an underlying metal wiring. The porous alkyl-hydrogen silsesquioxane may also have an improved etching resistance to avoid being damaged in a subsequent etching process. An upper portion of the fifth insulation interlayer 265 may be removed by a planarization process, and then an oxide thin film (not shown) may be formed on the fifth insulation interlayer 265.

Figure 10:
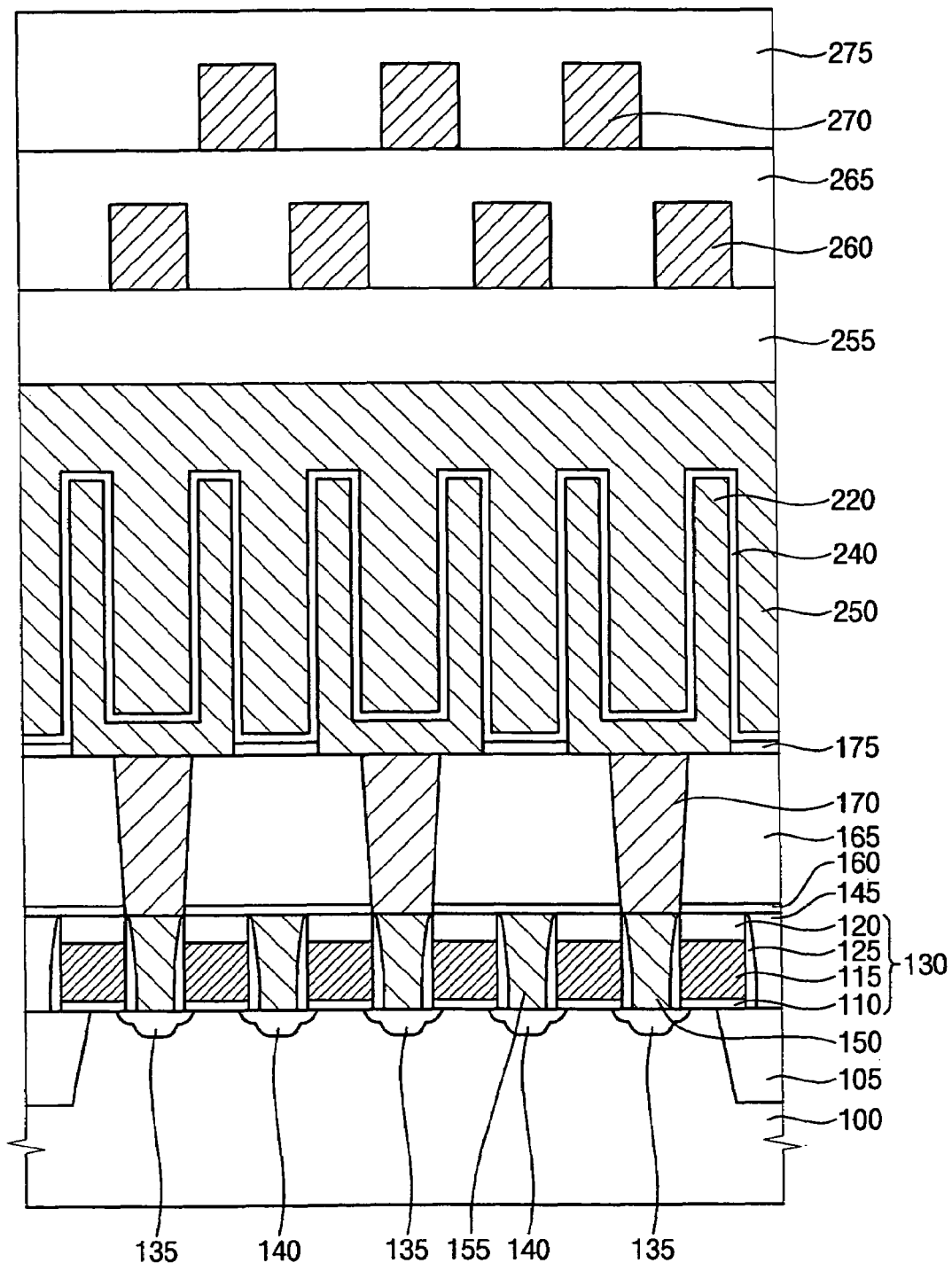

FIG. 10 is a cross-sectional view for explaining a step of forming a second metal wiring 270 and a sixth insulation interlayer 275 on the fifth insulation interlayer 265.

Referring to FIG. 10, the second metal wiring 270 is formed on the fifth insulation interlayer 265. The second metal wiring 270 may be formed using a metal such as aluminum, tungsten, or copper. For example, the second metal wiring 270 is formed using aluminum. The fifth insulation interlayer 265 having a dielectric constant of lower than or equal to about 2.5 may effectively reduce a parasitic capacitance between the first metal wiring 260 and the second metal wiring 270 as well as a parasitic capacitance between adjacent first metal wirings 260.

The sixth insulation interlayer 275 is formed on the fifth insulation interlayer 265 to cover the second metal wiring 260. The sixth insulation interlayer 275 may be formed using the spin-on glass composition of the present invention by substantially same processes as those of the fifth insulation interlayer 265.

Subsequently, ordinary processes of a semiconductor manufacturing may be performed to finish a semiconductor device. Semiconductor devices such as a large-scale integration (LSI) semiconductor device, a high-speed static random access memory (SRAM) device, a flash memory device, and so on, may be also manufactured using the spin-on glass composition of the present invention.

Preparation of a Spin-On Glass Composition

EXAMPLE 1

A spin-on glass composition was prepared by mixing about 6 percent by weight of the silsesquioxane oligomer represented by the formula 1, about 6 percent by weight of a porogen, about 100 parts per million of an additive and a remainder of a solvent. In the formula (1), R was a methyl group, and a ratio of n to m was about 1:1. The silsesquioxane oligomer was prepared by a condensation reaction of triethoxysilane with triethoxymethylsilane at a molar ratio of about 1:1. Polyalkylene glycol was used as the porogen, tetramethylammonium hydroxide was used as the additive, and propylene glycol dimethyl ether was used as the solvent.

EXAMPLE 2

A spin-on glass composition was prepared by substantially same processes as those of Example 1 except for the content of the silsesquioxane oligomer. About 3 percent by weight of the silsesquioxane was used for preparing the spin-on glass composition of Example 2.

EXAMPLE 3

A spin-on glass composition was prepared by substantially same processes as those of Example 1 except for the content of the silsesquioxane oligomer. About 10 percent by weight of the silsesquioxane was used for preparing the spin-on glass composition of Example 3.

EXAMPLE 4

A spin-on glass composition was prepared by substantially same processes as those of Example 1 except for the content of the silsesquioxane oligomer. About 20 percent by weight of the silsesquioxane was used for preparing the spin-on glass composition of Example 4.

COMPARATIVE EXAMPLE 1

A spin-on glass composition was prepared by mixing about 6 percent by weight of triethoxysilane, about 6 percent by weight of the porogen and a remainder of a solvent. Polyalkylene glycol was used as the porogen.

COMPARATIVE EXAMPLE 2

A spin-on glass composition was prepared by mixing about 6 percent by weight of triethoxymethylsilane, about 6 percent by weight of the porogen and a remainder of a solvent. Polyalkylene glycol was used as the porogen.

Figure 11:
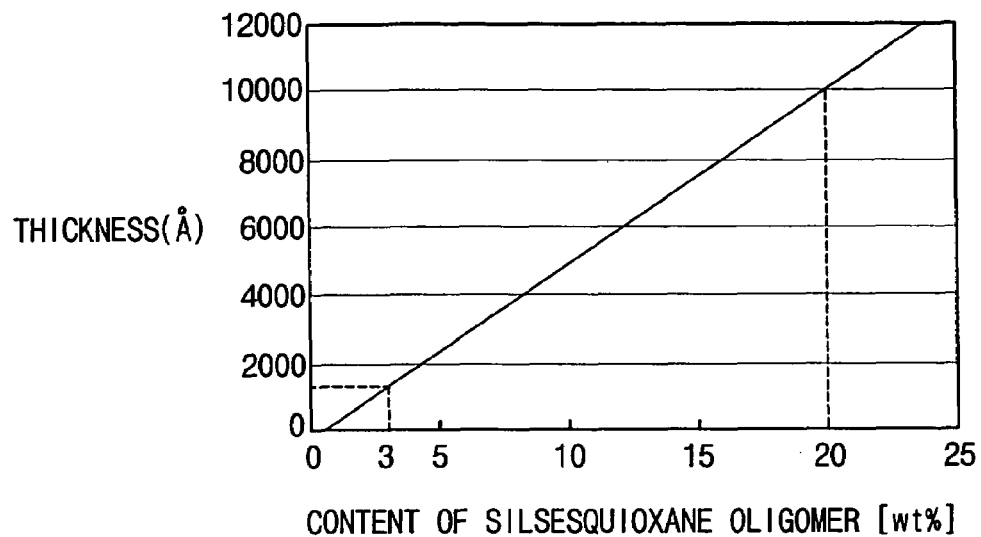
FIG. 11 is a graph showing a thickness variation of a porous silicon oxide layer in accordance with a content of a silsesquioxane oligomer in a spin-on glass composition.

Evaluation of Thickness Variation According to Content of Silsesquioxane Oligomer FIG. 11 is a graph showing a thickness variation of a porous silicon oxide layer in accordance with the amount of silsesquioxane oligomer in a spin-on glass composition.

Bare wafers were respectively spin-coated at about 2,000 rpm with each of the spin-on glass compositions prepared in Example 2 to 4.

Referring to FIG. 11, when the spin-on glass included about 3 percent by weight of the silsesquioxane oligomer, the spin-on glass layer having a thickness of about 1,500 Å was obtained. When the spin-on glass included about 10 percent by weight of the silsesquioxane oligomer, the spin-on glass layer having a thickness of about 4,500 Å was obtained. When the spin-on glass included about 20 percent by weight of the silsesquioxane oligomer, the spin-on glass layer having a thickness of about 10,000 Å was obtained.

Therefore, when the content of the silsesquioxane oligomer in the spin-on glass composition is less than about 3 percent by weight, a porous silicon oxide layer has a thickness of smaller than about 1,500 Å, which is not sufficient to reduce a parasitic capacitance and to enhance a response speed of a semiconductor device. In addition, when the content of the silsesquioxane oligomer is greater than about 20 percent by weight, a porous silicon oxide layer has a thickness of larger than about 10,000 Å so that a crack may be easily generated in the porous silicon oxide layer.

Evaluation of Hydrocarbon Generation According to a Temperature

Figure 12:
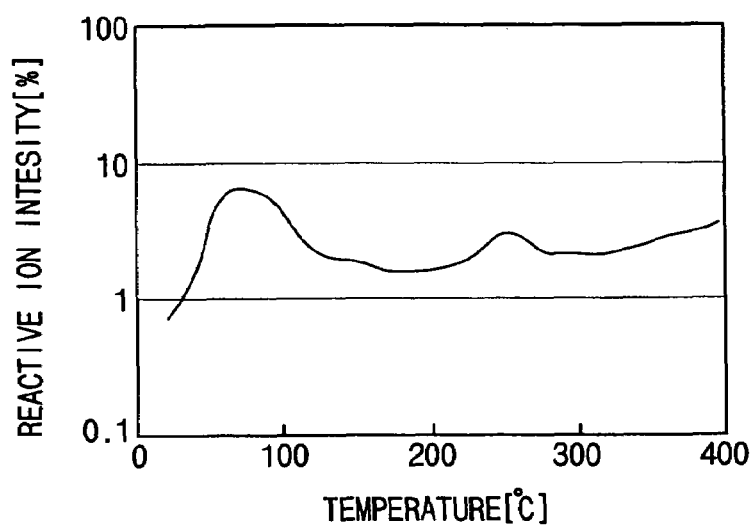
FIG. 12 is a graph showing a generation of a hydrocarbon gas from a spin-on glass layer in accordance with a temperature of a thermal treatment.

FIG. 12 is a graph showing the generation of hydrocarbon gas from a spin-on glass layer in accordance with the temperature of a thermal treatment.

The spin-on glass layer was prepared using the spin-on glass composition of Example 1. While the spin-on glass layer was thermally pre-baked at a temperature of about 20° C. to about 400° C., an amount of a hydrocarbon gas generated from the spin-on glass layer was analyzed using an atomic pressure ionization mass spectrometer (APIMS). The solvent and the porogen in the spin-on glass layer may be thermally decomposed to generate the hydrocarbon gas.

Referring to FIG. 12, the generation of the hydrocarbon gas increased at about 80° C. and about 250° C. It may be noted that the generation of the hydrocarbon gas at about 80° C. is an evaporation of the solvent, and the generation of the hydrocarbon gas at about 250° C. is a decomposition of the porogen. Therefore, the pre-baking process may be preferably performed by two steps. The spin-on glass layer may be first pre-baked at a temperature of about 70° C. to about 150° C. to remove the solvent from the spin-on glass layer, and then second pre-baked at a temperature of about 150° C. to about 350° C. to generate pores in the spin-on glass layer.

Figure 13:
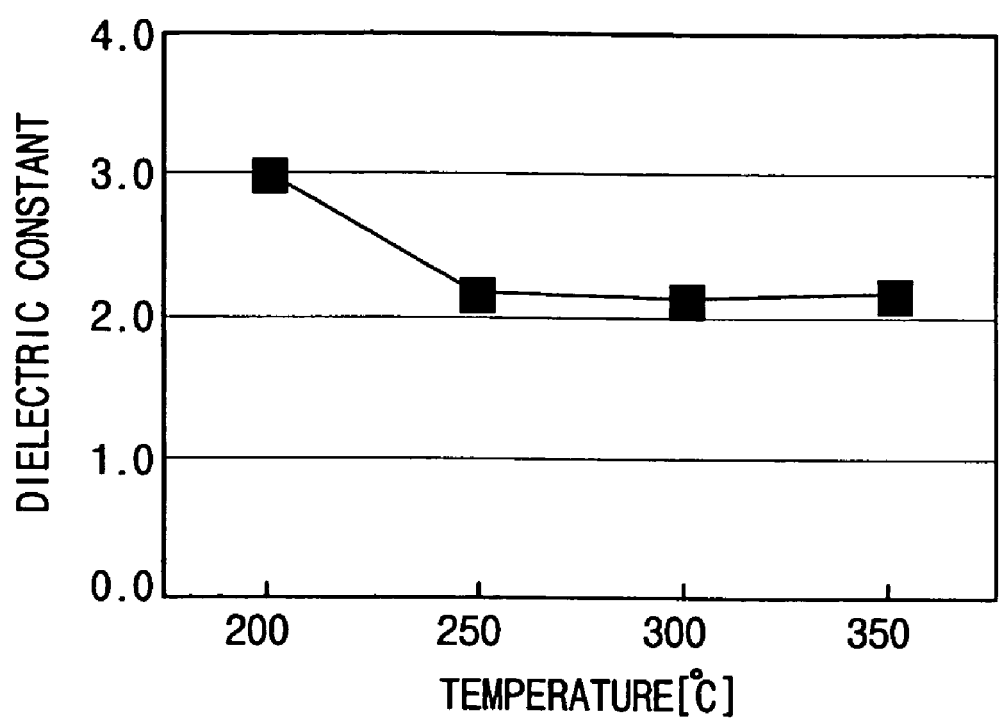
FIG. 13 is a graph showing a dielectric constant variation of a porous silicon oxide layer in accordance with a temperature of a second pre-baking process.

Evaluation of a Dielectric Constant According to a Temperature of a Second Pre-Baking Process FIG. 13 is a graph showing a dielectric constant variation of a porous silicon oxide layer in accordance with a temperature of a second pre-baking process.

Four spin-on glass layers were prepared using the spin-on glass composition of Example 1. The spin-on glass layers were first pre-baked at a temperature of about 100° C. The spin-on glass layers were respectively second pre-baked at a temperature of about 200° C., about 250° C., about 300° C. and about 350° C. After the second pre-baking process, the spin-on glass layers were main-baked at a temperature of about 400° C. for about 30 minutes to convert the spin-on glass layers into porous silicon oxide layers. Dielectric constants of the porous silicon oxide layers were measured and are shown in FIG. 13.

Referring to FIG. 13, when the second pre-baking process is performed at a temperature of lower than about 250° C., it may be noted that the dielectric constant of the porous silicon oxide layer is higher than about 2.3. In addition, when the second pre-baking process is performed at a temperature higher than about 250° C., it may be noted that the dielectric constant of the porous silicon oxide layer is about 2.2. Therefore, it may be confirmed that the second pre-baking process is preferably performed at a temperature higher than about 250° C.

Evaluation of Etch Rates of Porous Silicon Oxide Layers

Etch rates of first, second and third porous silicon oxide layers were evaluated. The first porous silicon oxide layer corresponded to a porous methyl-hydrogen silsesquioxane layer (P-MHSQ) formed using the spin-on glass composition prepared in Example 1, the second porous silicon oxide layer corresponded to a conventional porous hydrogen silsesquioxane layer (P-HSQ), and the third porous silicon oxide layer corresponded to a conventional porous methyl silsesquioxane layer (P-MSQ).

To form the first porous silicon oxide layer, a first spin-on glass layer was formed on a bare wafer by coating the bare wafer with the spin-on glass composition prepared in Example 1. The first spin-on glass layer was first pre-baked at a temperature of about 80° C. to about 150° C. for about 6 minutes, and then second pre-baked at a temperature of about 300° C. for about 3 minutes. The first spin-on glass layer was main-baked at a temperature of about 400° C. for about 30 minutes. The first and the second pre-baking processes and the main-baking process were performed under an atmosphere including nitrogen gas. Through the baking processes, the first spin-on glass layer was converted into the porous methyl-hydrogen silsesquioxane layer including a Si—H bond and a S—$CH_3$ bond by a ratio of about 1:1. The porous methyl-hydrogen silsesquioxane layer (P-MHSQ) thus obtained had a dielectric constant of about 2.25 and a thickness of about 5,000 Å.

To form the second porous silicon oxide layer, a second spin-on glass layer was formed on a bare wafer by coating the bare wafer with the spin-on glass composition prepared in Comparative Example 1. The second spin-on glass layer was pre-baked at a temperature of about 100° C. to about 300° C. for about 10 minutes, and then the second spin-on glass layer was main-baked at a temperature of about 400° C. for about 30 minutes. The pre-baking process and the main-baking process were performed under an atmosphere including nitrogen gas, oxygen gas and water vapor. Though the baking processes, the second spin-on glass layer was converted into the porous hydrogen silsesquioxane layer. The porous hydrogen silsesquioxane layer (P-HSQ) thus obtained had a dielectric constant of about 2.5 and a thickness of about 5,000 Å.

The third porous silicon oxide layer was formed by substantially the same processes as those of the second porous silicon oxide layer except that the spin-on glass composition prepared in Comparative Example 2 was used instead of the spin-on glass composition prepared in Comparative Example 1. The porous methyl silsesquioxane layer (P-MSQ) thus obtained had a dielectric constant of about 2.3 and a thickness of about 5,000 Å.

Figure 14:
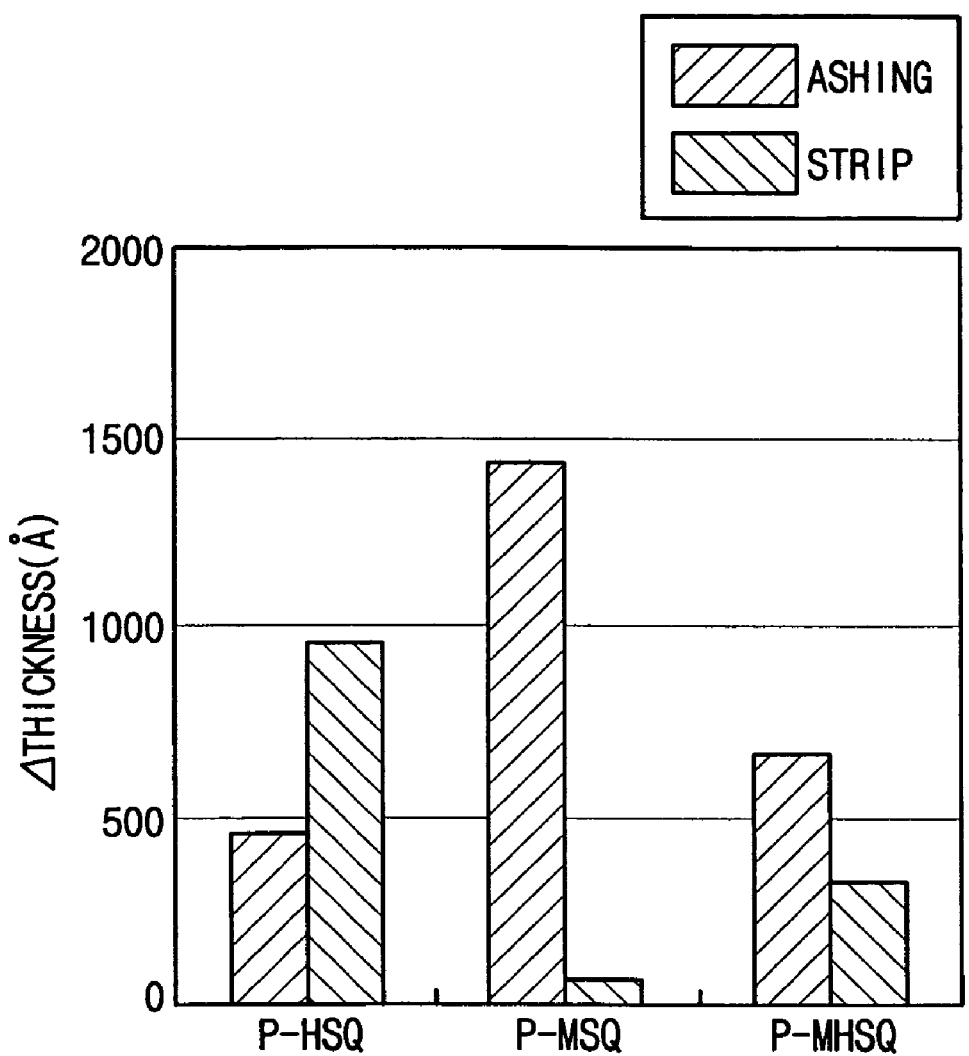
FIG. 14 is a graph showing etch rates of first to third porous silicon oxide layers in ashing and stripping processes.

After an ashing process and a stripping process were performed on the first to the third porous silicon oxide layers, etch rates were evaluated by measuring thickness decreases of the first to the third porous silicon oxide layers. The thickness decreases are shown in FIG. 14. The ashing process was performed using oxygen plasma at a temperature of about 280° C. for about 2 minutes. The stripping process was performed using an organic cleaning solution including amine for about 20 minutes. EKC245 (trade name, manufactured by Dupont Electronic Technology; U.S.A.) was used as the organic cleaning solution.

FIG. 14 is a graph showing etch rates of the first to the third porous silicon oxide layers in the ashing and stripping processes.

Referring to FIG. 14, the second porous silicon oxide layer (P-HSQ) had an etch rate in the ashing process relatively lower than those of the first and the third porous silicon oxide layers (P-MHSQ and P-MSQ). However, the second porous silicon oxide layer (P-HSQ) had an etch rate in the stripping process relatively higher than those of the first and the third porous silicon oxide layers (P-MHSQ and P-MSQ). Therefore, it may be noted that the second porous silicon oxide layer (P-HSQ) was excessively removed during the stripping process for removing a photoresist pattern.

The third porous silicon oxide layer (P-MSQ) had an etch rate during the stripping process relatively lower than those of the first and the second porous silicon oxide layers (P-MHSQ and P-HSQ). However, the third porous silicon oxide layer (P-MSQ) had an etch rate in the ashing process significantly higher than those of the first and the second porous silicon oxide layers (P-MHSQ and P-HSQ). Therefore, it may be noted that the third porous silicon oxide layer (P-MSQ) was excessively removed during the ashing process for removing a photoresist pattern.

The first porous silicon oxide layer (P-MHSQ) had an etch rate during the ashing process that was relatively lower than that of the third porous silicon oxide layers (P-MSQ). The first porous silicon oxide layer (P-MHSQ) had an etch rate during the stripping process that was relatively lower than that of the second porous silicon oxide layers (P-HSQ). Therefore, it was confirmed that the first porous silicon oxide layer (P-MHSQ) had both of an ashing resistance of the second porous silicon oxide layer (P-HSQ) and a stripping resistance of the third porous silicon oxide layer (P-MSQ). As a result, the first porous silicon oxide layer formed using the spin-on glass composition according to embodiments of the present invention had a dielectric constant lower than about 2.5, and an enhanced etching resistance in the ashing process and the stripping process for removing a photoresist pattern.

Evaluation of Absorbances of Porous Silicon Oxide Layers

Absorbances of first to third porous silicon oxide layers were evaluated after a stripping process. The first to the third porous silicon oxide layers were prepared by substantially the same processes as those of the etch rate evaluation described with reference to FIG. 14. Before the stripping process, the first porous silicon oxide layer (P-MHSQ) included a Si—O bond, a Si—H bond and a Si—CH$_3$ bond, the second porous silicon oxide layer (P-HSQ) included a Si—O bond and a Si—H bond, and the third porous silicon oxide layer (P-MSQ) included a Si—O bond and a Si—CH$_3$ bond. The stripping process was performed using an organic cleaning solution including amine for about 20 minutes. EKC245 (trade name, manufactured by Dupont Electronic Technology; U.S.A.) was used as the organic cleaning solution. The absorbances of the first to third porous silicon oxide layers were measured using a Fourier transform-infrared (FT-IR) spectrometer. The results are shown in FIG. 15.

Figure 15:
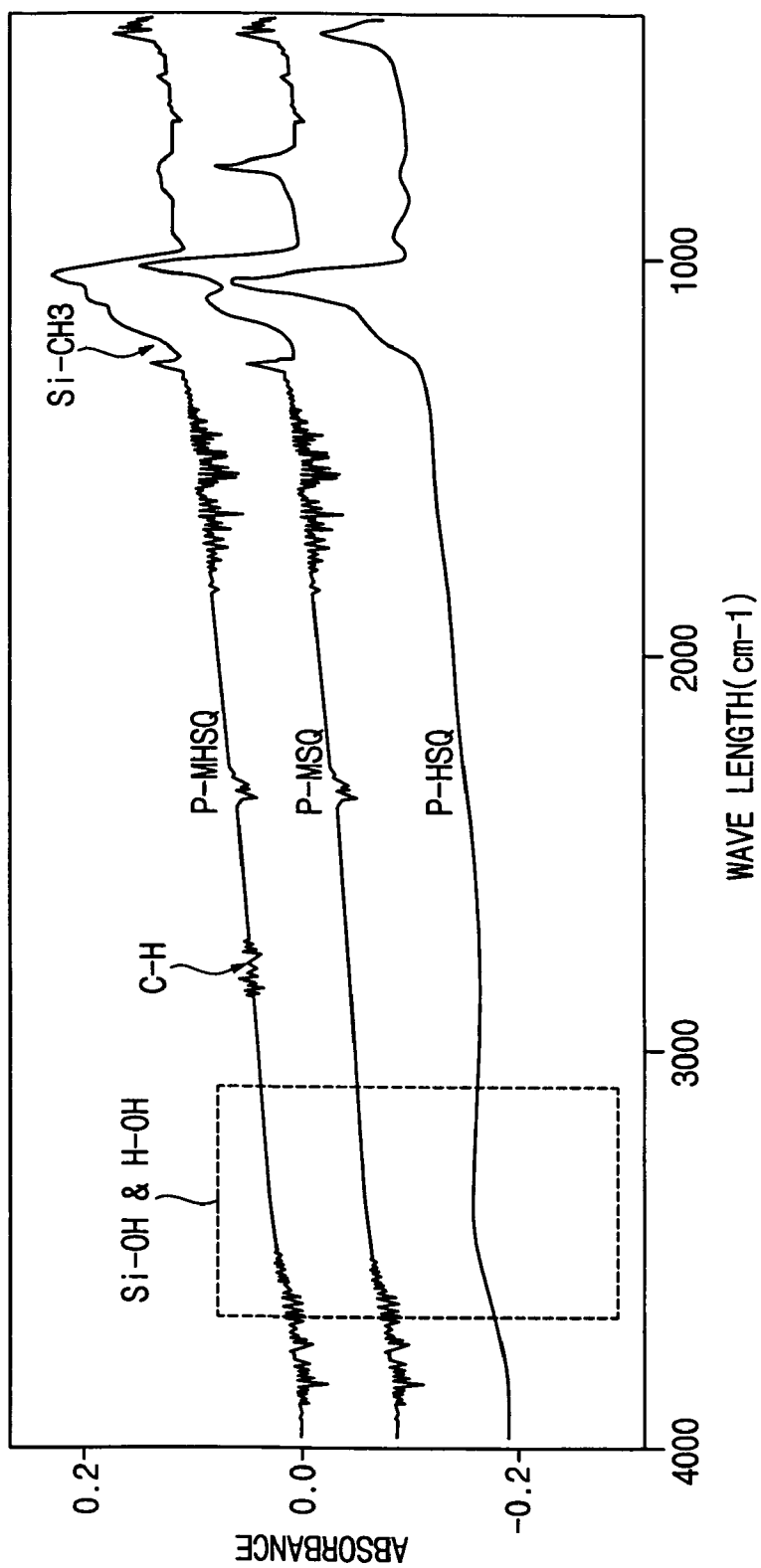
FIG. 15 is a FT-IR spectrum showing absorbances of first to third porous silicon oxide layers after a stripping process.

FIG. 15 is a FT-IR spectrum showing absorbances of the first to third porous silicon oxide layers after the stripping process. The FT-IR spectrum is a graph showing an absorbance (a.u.) in accordance with a wavelength (cm$^{-1}$).

Referring to FIG. 15, peaks corresponding to a Si—O bond, Si—OH bond and a H—OH bond were observed from the second porous silicon oxide layer on which the stripping process was performed. Peaks corresponding to a Si—O bond, a Si—OH bond and a H—OH bond were also observed from the first porous silicon oxide layer on which the stripping process was performed.

It was noted that a Si—H bond at about 2,250 cm$^{-1}$ was removed and a Si—OH bond and a H—OH bond at about 3,000 cm$^{-1}$ to about 3,700 cm$^{-1}$ were generated while the stripping process was performed on the first and second porous silicon oxide layers. The Si—H bond was attacked by amine in the organic cleaning solution to generate the Si—OH bond and the H—OH bond. Thus, it was noted that the first and second porous silicon oxide layers absorbed water. However, although the Si—H bond was removed from the first silicon oxide layer, the first silicon oxide layer still included a Si—CH$_3$ bond. Thus, it was noted that the first porous silicon oxide layer had an enhanced stripping resistance compared with that of the second porous silicon oxide layer.

Evaluation of Adhesion Characteristics of a First Porous Silicon Oxide Layer

A first silicon oxide layer was formed on an aluminum wiring that was formed on a substrate in a cell area and a peripheral circuit area. The first silicon oxide layer was formed by a CVD process. A first porous silicon oxide layer was formed on the first silicon oxide layer, and then a second silicon oxide layer was formed on the first porous silicon oxide layer by a CVD process. The first porous silicon oxide layer was prepared by substantially the same processes as those of the etch rate evaluation described with reference to FIG. 14. The first porous silicon oxide layer corresponds to a porous methyl-hydrogen silsesquioxane layer (P-MHSQ). The substrate was sectioned and observed using a scanning electron microscope (SEM).

Figure 16:
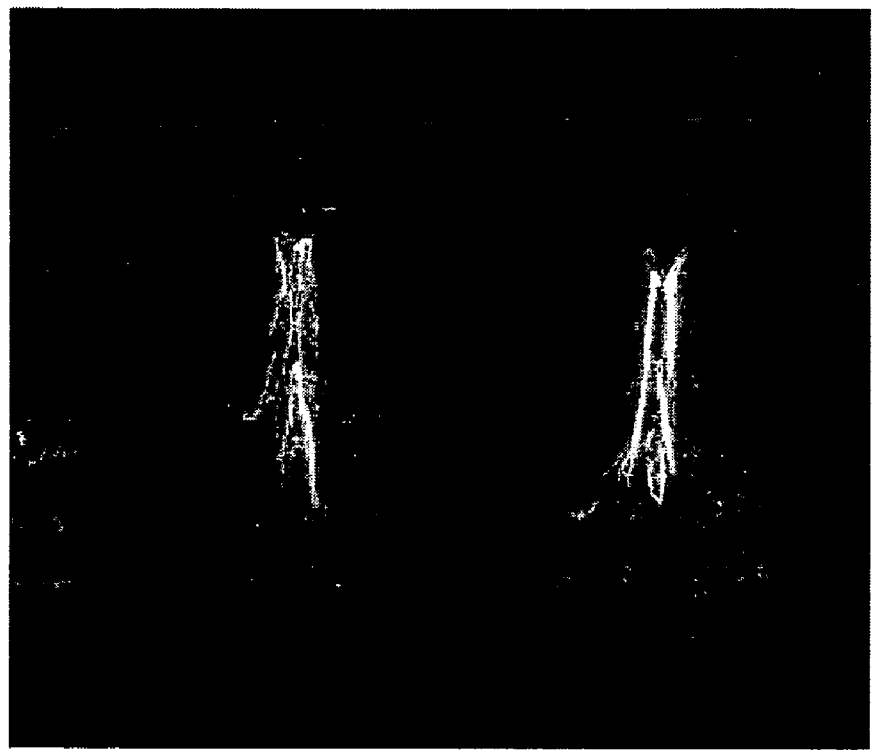
FIG. 16 is a SEM picture showing adhesion characteristics of a first porous silicon oxide layer in a cell area of a substrate.
Figure 17:
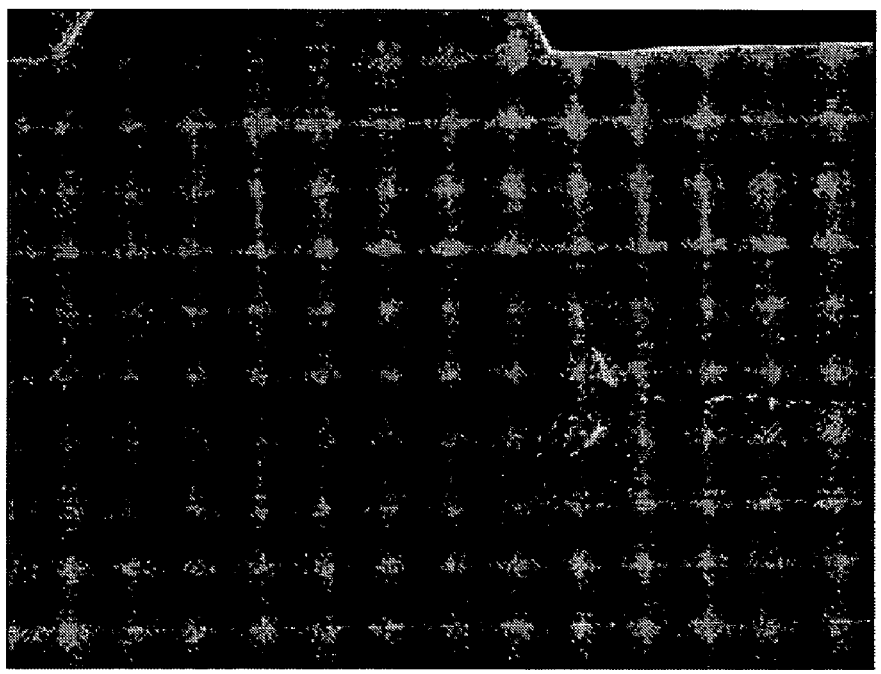
FIG. 17 is a SEM picture showing adhesion characteristics of the first porous silicon oxide layer in a peripheral circuit area of the substrate.

FIG. 16 is a SEM picture showing adhesion characteristics of the first porous silicon oxide layer in the cell area of the substrate. FIG. 17 is a SEM picture showing adhesion characteristics of the first porous silicon oxide layer in the peripheral circuit area of the substrate.

Referring to FIG. 16, the first porous silicon oxide layer adheres well to the first silicon oxide layer formed on a sidewall and an upper face of the aluminum wiring in the cell area of the substrate without a void. Thus, it may be confirmed that the first porous silicon oxide layer has favorable adhesion characteristics to the first silicon oxide layer formed on a sidewall and an upper face of the aluminum wiring in the cell area.

Referring to FIG. 17, the first porous silicon oxide layer also adheres to the second silicon oxide layer formed over a sidewall and an upper face of the aluminum wiring in the peripheral circuit area of the substrate without a void. Thus, it may be confirmed that the first porous silicon oxide layer has favorable adhesion characteristics to the second silicon oxide layer formed over a sidewall and an upper face of the aluminum wiring in the peripheral circuit area.

Evaluation of Adhesion Characteristics of a Second Porous Silicon Oxide Layer

A first silicon oxide layer was formed on an aluminum wiring that was formed on a substrate in a cell area and a peripheral circuit area. The first silicon oxide layer was formed by a CVD process. A second porous silicon oxide layer was formed on the first silicon oxide layer, and then a second silicon oxide layer was formed on the second porous silicon oxide layer by a CVD process. The second porous silicon oxide layer was prepared by substantially the same processes as those of the etch rate evaluation described with reference to FIG. 14. The second porous silicon oxide layer corresponds to a porous hydrogen silsesquioxane layer (P—HSQ). The substrate was sectioned and observed using a scanning electron microscope (SEM).

Figure 18:
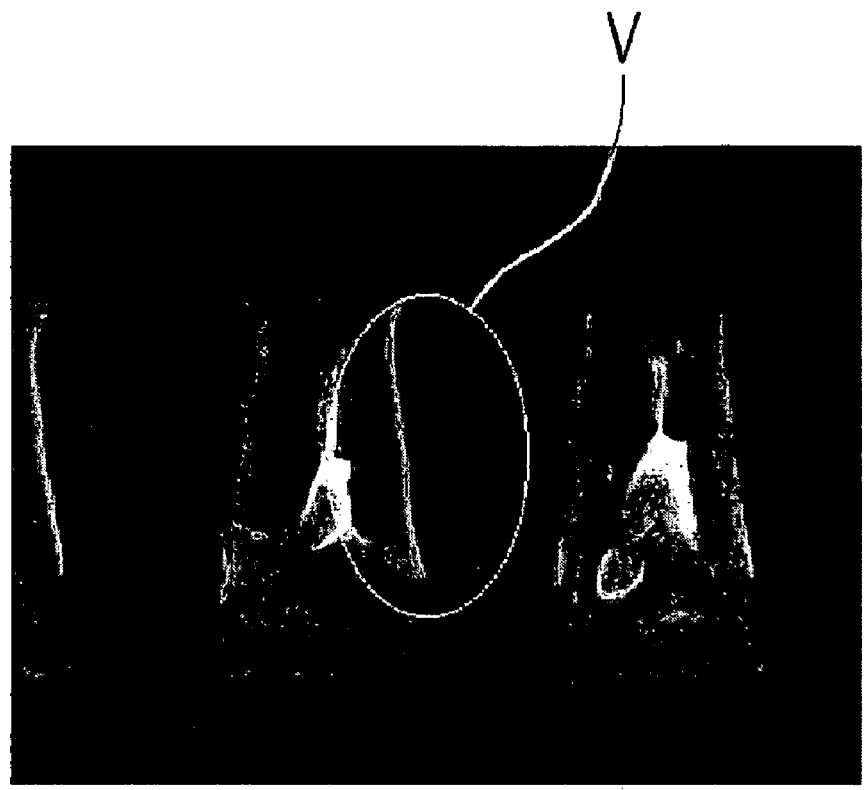
FIG. 18 is a SEM picture showing adhesion characteristics of a second porous silicon oxide layer in a cell area of a substrate.
Figure 19:
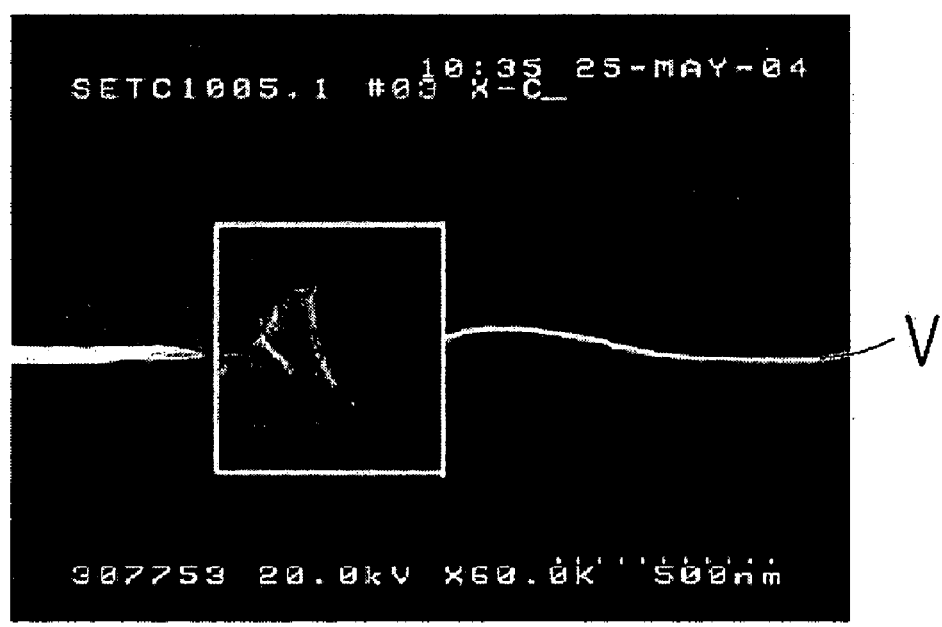
FIG. 19 is a SEM picture showing adhesion characteristics of the second porous silicon oxide layer in a peripheral circuit area of a substrate.

FIG. 18 is a SEM picture showing adhesion characteristics of the second porous silicon oxide layer in the cell area of the substrate. FIG. 19 is a SEM picture showing adhesion characteristics of the second porous silicon oxide layer in the peripheral circuit area of the substrate.

Referring to FIG. 18, voids (V) are observed between the second porous silicon oxide layer and a sidewall of the aluminum wiring formed on the substrate in the cell area. Referring to FIG. 19, voids (V) are also observed between the second porous silicon oxide layer and a sidewall of the aluminum wiring formed on the substrate in the peripheral circuit area. Therefore, the second porous silicon oxide layer has poor adhesion characteristics to the first silicon oxide layer formed on the sidewall of the aluminum wiring.

Evaluation of Adhesion Characteristics of a Third Porous Silicon Oxide Layer

A first silicon oxide layer was formed on an aluminum wiring that was formed on a substrate in a cell area and a peripheral circuit area. The first silicon oxide layer was formed by a CVD process. A third porous silicon oxide layer was formed on the first silicon oxide layer, and then a second silicon oxide layer was formed on the second porous silicon oxide layer by a CVD process. The third porous silicon oxide layer was prepared by substantially the same processes as those of the etch rate evaluation described with reference to FIG. 14. The third porous silicon oxide layer corresponds to a porous methyl silsesquioxane layer (P-MSQ). The substrate was sectioned and observed using a scanning electron microscope (SEM).

Figure 20:
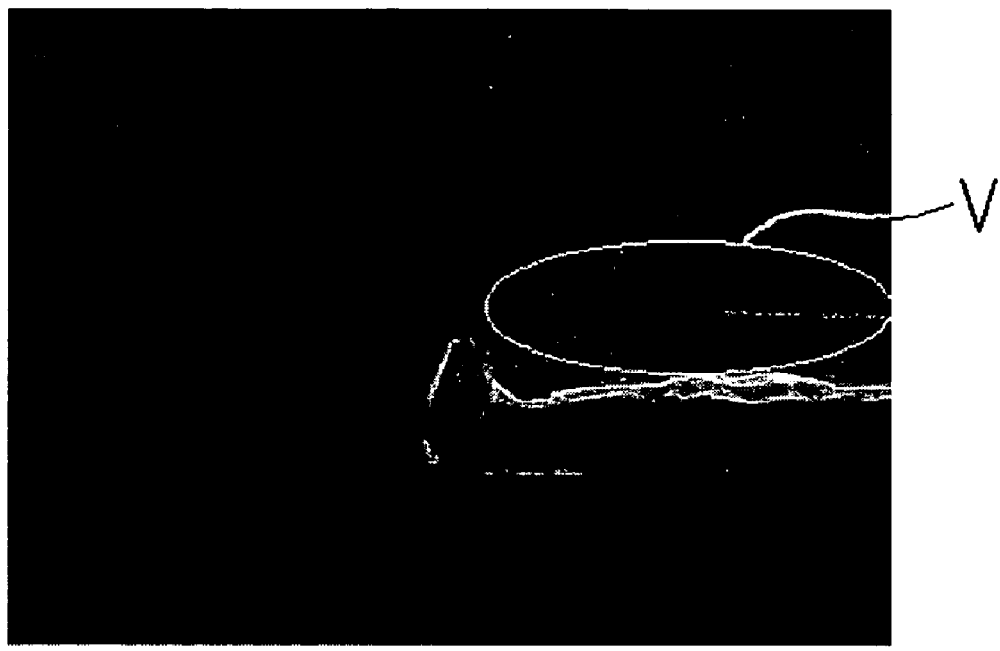
FIG. 20 is a SEM picture showing adhesion characteristics of a third porous silicon oxide layer in a peripheral circuit area of a substrate.

FIG. 20 is a SEM picture showing adhesion characteristics of the third porous silicon oxide layer in the peripheral circuit area of the substrate.

Referring to FIG. 20, voids (V) were observed between the third porous silicon oxide layer and a sidewall and an upper face of the aluminum wiring formed on the substrate in the peripheral circuit area. Therefore, it was noted that the third porous silicon oxide layer had poor adhesion characteristics to the first silicon oxide layer formed on the sidewall of the aluminum wiring and the second silicon oxide layer formed over the upper face of the aluminum wiring.

According to the present invention, a spin-on glass composition including a silsesquioxane oligomer may be used for forming a porous silicon oxide layer that has a low dielectric constant and favorable adhesion characteristics to underlying and overlying layers.

In addition, the porous silicon oxide layer formed using the spin-on glass composition according to embodiments of the present invention may include a Si—H bond and Si—R bond at a ratio of about 1:0.4 to about 1:2.4, so that the porous silicon oxide layer may be prevented from being damaged in an etching process using an amine-based etching solution and in an ashing process using oxygen plasma.

Furthermore, the porous silicon oxide layer may be formed by first and second pre-baking process and a main-baking process under an atmosphere including an inactive gas without oxygen gas, so that a rapid shrinkage of the porous silicon oxide layer may be prevented and adhesion characteristics to underlying and overlying layers may be enhanced. The porous silicon oxide layer may also have a good flatness and a thermal stability.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a porous silicon oxide layer, comprising:

forming a spin-on glass layer on a substrate by coating the substrate with a spin-on glass composition which includes a solvent, about 3 to about 20 percent by weight of a porogen, and about 3 to about 20 percent by weight of a silsesquioxane oligomer represented by formula (1),

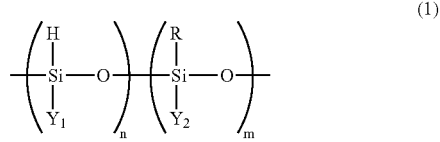

wherein, in the formula (1), $Y_1$ and $Y_2$ independently represent a hydrolyzable alkoxy group, R represents a lower alkyl group, and n and m independently represent an integer in a range of one to nine both inclusive; and baking the spin-on glass layer to form the porous silicon oxide layer.

2. The method of claim 1, wherein, in the formula 1, a ratio of n:m is in a range of about 1:0.4 to about 1:2.4.

3. The method of claim 1, wherein the alkoxy group comprises any one selected from the group consisting of a methoxy group, an ethoxy group, an isopropoxy group and a butoxy group, and the alkyl group comprises any one selected from the group consisting of a methyl group, an ethyl group, a propyl group and a butyl group.

4. The method of claim 1, further comprising forming an oxide layer on the substrate using a chemical vapor deposition process.

5. The method of claim 1, further comprising forming a conductive pattern on the substrate.

6. The method of claim 1, wherein the spin-on glass composition includes about 4 to about 12 percent by weight of the silsesquioxane oligomer, and about 4 to about 12 percent by weight of the porogen.

7. The method of claim 1, wherein baking the spin-on glass layer comprises:
   pre-baking the substrate at a temperature of about 70° C. to about 350° C. to remove the solvent from the spin-on glass layer and decompose the porogen; and
   main-baking the substrate at a temperature of about 350° C. to about 550° C. to convert the spin-on glass layer to the porous silicon oxide layer.

8. The method of claim 7, wherein pre-baking the substrate is performed under an atmosphere including an inactive gas for about 3 to about 15 minutes.

9. The method of claim 7, wherein pre-baking the substrate comprises:
   first pre-baking the substrate at a temperature of about 70° C. to about 150° C. to remove the solvent from the spin-on glass layer; and
   second pre-baking the substrate at a temperature of about 150° C. to about 350° C. to decompose the porogen.

10. The method of claim 7, wherein main-baking the substrate is performed under an atmosphere including an inactive gas for about 10 to about 100 minutes.

11. The method of claim 1, wherein the porous silicon oxide layer comprises a Si—H bond and a Si—R bond at a ratio of about 1:0.4 to about 1:2.4.

\* \* \* \* \*